(12) United States Patent
Choudhury et al.

(10) Patent No.: US 9,806,002 B2
(45) Date of Patent: Oct. 31, 2017

(54) MULTI-REFERENCE INTEGRATED HEAT SPREADER (IHS) SOLUTION

(71) Applicant: INTEL CORPORATION, Santa Clara, CA (US)

(72) Inventors: Arnab Choudhury, Chandler, AZ (US); John Beatty, Chandler, AZ (US); Prakriti Choudhary, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,845

(22) Filed: Dec. 23, 2015

(65) Prior Publication Data
US 2017/0186665 A1 Jun. 29, 2017

(51) Int. Cl.
*H01L 23/10* (2006.01)
*H01L 21/00* (2006.01)
(Continued)

(52) U.S. Cl.
CPC ...... *H01L 23/3675* (2013.01); *H01L 21/4871* (2013.01); *H01L 21/4882* (2013.01); *H01L 23/3735* (2013.01)

(58) Field of Classification Search
CPC ............. H01L 21/4882; H01L 23/3675; H01L 23/3735
See application file for complete search history.

(56) References Cited

U.S. PATENT DOCUMENTS 5,396,403 A * 3/1995 Patel ............... H01L 23/433
257/713
5,623,394 A * 4/1997 Sherif ............ H01L 23/3737
165/185
(Continued)

FOREIGN PATENT DOCUMENTS

KR 10-2014-0106451 A 9/2014
KR 10-2015-0091886 A 8/2015

OTHER PUBLICATIONS

PCT Notification of Transmittal of The International Search Report and The Written Opinion of the International Searching Authority; or The Declaration for PCT Counterpart Application No. PCT/US2016/056887 Containing International Search Report, 10 pgs. (dated Jan. 10, 2017).

*Primary Examiner* — Alonzo Chambliss
(74) *Attorney, Agent, or Firm* — Schwabe, Williamson & Wyatt P.C.

(57) ABSTRACT

Methods, systems, and apparatuses that assist with cooling semiconductor packages, such as multi-chip packages (MCPs) are described. A semiconductor package includes a component on a substrate. The component can include one or more semiconductor dies. The package can also include a multi-reference integrated heat spreader (IHS) solution (also referred to as a smart IHS solution), where the smart IHS solution includes a smart IHS lid. The smart IHS lid includes a cavity formed in a central region of the smart lid. The smart IHS lid can be on the component, such that the cavity corresponds to the component. A first thermal interface material layer (TIM-layer 1) can be on the component. An individual IHS lid (IHS slug) can be on the TIM-layer 1. The IHS slug can be inserted into the cavity. Furthermore, an intermediate thermal interface material layer (TIM-1A layer) can be between the IHS slug and the cavity.

23 Claims, 11 Drawing Sheets

(51) Int. Cl.
*H05K 7/20* (2006.01)
*H01L 23/367* (2006.01)
*H01L 23/373* (2006.01)
*H01L 21/48* (2006.01)

(56) References Cited

U.S. PATENT DOCUMENTS

| | | | | |
|---|---|---|---|---|
| 6,275,381 | B1* | 8/2001 | Edwards | H05K 7/20454 165/185 |
| 6,979,899 | B2* | 12/2005 | Edwards | H01L 23/36 257/704 |
| 7,291,913 | B2* | 11/2007 | Edwards | H01L 23/36 257/704 |
| 7,476,568 | B2* | 1/2009 | Lu | H01L 21/6835 257/E21.054 |
| 7,944,046 | B2* | 5/2011 | Chao | H01L 23/10 165/185 |
| 2005/0018402 | A1* | 1/2005 | Oman | H01L 23/4338 361/709 |
| 2006/0220225 | A1* | 10/2006 | Ni | H01L 23/433 257/712 |
| 2009/0034206 | A1* | 2/2009 | Lu | H01L 21/6835 361/718 |
| 2010/0001410 | A1 | 1/2010 | Kang | |
| 2013/0119529 | A1* | 5/2013 | Lin | H01L 23/3675 257/704 |
| 2014/0002989 | A1 | 1/2014 | Ahuja et al. | |
| 2014/0264821 | A1 | 9/2014 | Tang et al. | |
| 2015/0035135 | A1* | 2/2015 | Hung | H01L 23/3672 257/712 |
| 2015/0115433 | A1* | 4/2015 | Lin | H01L 23/3675 257/712 |
| 2015/0155218 | A1 | 6/2015 | Hung et al. | |
| 2015/0357258 | A1* | 12/2015 | Fitzgerald | H01L 23/3675 257/713 |

* cited by examiner

MULTI-REFERENCE INTEGRATED HEAT SPREADER (IHS) SOLUTION

FIELD

Embodiments described herein generally relate to semiconductor packages, and specially, to methods, systems, and apparatuses for cooling semiconductor packages.

BACKGROUND

One type of semiconductor package is a multi-chip semiconductor package or multi-chip package (MCP), which is an electronic package with multiple components—e.g., integrated circuits (ICs), semiconductor dies or other discrete components—that are packaged onto a substrate. MCPs can be formed using three-dimensional (3D) packaging technologies that exploit the z-height dimension by stacking semiconductor dies in a vertical configuration to make the resultant MCP footprint in the x-y dimensions smaller. Examples of packages created by 3D packaging technologies include package-on-package (PoP) solutions, package-in-package (PiP) solutions, embedded wafer level (eWLB) packages, etc.

Integrated heat spreader (IHS) solutions can be used in MCPs to dissipate unwanted heat produced by the components of MCPs. One disadvantage of stacking dies in an MCP is that the z-height of components in the MCP can vary, which can have negative effects on the performance capabilities of the MCP by increasing unwanted heat production. Typical integrated heat spreader (IHS) solutions do not work as effectively because of these variations in component height. FIGS. 1A-1B illustrate this issue.

FIG. 1A is a cross-sectional view of a typical MCP 100 that includes a typical IHS solution. As shown in FIG. 1A, components 103 and 104, each of which can include semiconductor die(s), are on a substrate 101. In the MCP 100, a typical IHS solution is used for dissipation of unwanted heat produced by the components 103 and 104. This typical IHS solution includes a typical IHS lid 102, a first thermal interface material layer (TIM-1 layer) 105 on the component 104, and a TIM-1 layer 106 on the component 103. Sidewall regions of the typical IHS lid 102 are attached to the substrate 101 using a sealant (not shown), such that the typical IHS lid 102 is over the components 103 and 104. The TIM-1 layers 105 and 106 couple the components 104 and 103, respectively, to a central region of the typical IHS lid 102 thermally and/or mechanically.

The components 103 and 104 have varying z-heights from each other, which are collectively referred to as a height variation. Specifically, this height variation occurs because the component 104 has a larger z-height than the component 103. This height variation can include a natural height variation inherent in the manufacturing processes used to create components 103 and 104. This natural height variation can occur regardless of whether the manufacturing process used to manufacture the component 103 is the same as or different from the manufacturing process used to manufacture the component 104. Another contributor to the height variation affecting the components 103 and 104 can result from attachment mechanisms or techniques used to attach components 103 and 104 to the substrate 101. For example, if the component 103 represents a die mounted on a substrate 101 via a ball grid array (BGA) assembly (not shown), while the component 104 represents a die directly attached to substrate 101, then there can be some differences between the z-height of the components 103 and the component 104.

In addition to their heat dissipation functions, the TIM-1 layer 105 and TIM-1 layer 106 are used to compensate for this height variation. As shown in FIG. 1A, TIM-1 layer 106 is thicker than TIM-1 layer 105 to compensate for the component height difference. Compensating for the height variation affecting the components 103 and 104 occurs at the expense of increasing the z-height or bond line thickness (BLT) of the TIM-1 layers 106 and 105. Thicker BLTs of the TIM-1 layers 106 and 105, however, reduce the cooling capabilities of the TIM-1 layers 106 and 105, which in turn leads to higher chip junction temperature ($T_j$), limited bandwidth, frequency, greater power leakage, and the like. Additionally, absorption of the height variation by the TIM-1 layers 105 and 106 can limit choices of TIM-1 materials used for forming the TIM-1 layers 105 and 106.

Currently, an architectural IHS solution in the form of a typical three-dimensional IHS solution (typical 3D IHS solution) can avoid increasing the BLTs of the TIM-1 layers. Nevertheless, this typical 3D IHS solution fails to remedy the shortcomings of the typical IHS solution described above in connection with FIG. 1A.

FIG. 1B is a cross-sectional view of a typical MCP 150 having a typical 3D IHS solution for dissipating heat produced by the components 123 and 124. This typical 3D IHS solution includes a typical IHS lid 122, a TIM-1 layer 126 on the component 123, a TIM-1 layer 125 on the component 124, a copper (Cu) foil 127 on the TIM-1 layer 126, a Cu foil 131 on the TIM-1 layer 125, an intermediate thermal interface material layer (TIM-1A layer) 129 on the Cu foil 127, and a TIM-1A layer 133 on the Cu foil 131. In FIG. 1B, the Cu foils 127 and 131 are coupled to the typical IHS lid 122 using TIM-1A layers 129 and 133, respectively. Each respective combination of a Cu foil and a TIM-1A layer acts as an individual IHS solution for its respective component. The BLT of the TIM-1 layer 126 is substantially equal to the BLT of the TIM-1 layer 125. Moreover, the z-height of the Cu foil 127 is substantially equal to the z-height of the Cu foil 131. Consequently, the height variation affecting the components 123 and 124 is absorbed by the TIM-1A layers 129 and 133, respectively. As shown in FIG. 1B, the BLT of the TIM-1A layer 129 is larger than the BLT of the TIM-1A layer 133. Thus, the height variation affecting the components 123 and 124 is transferred from the TIM-1 layers 126 and 125 to the TIM-1A layers 129 and 133, respectively. Increases in the BLTs of the TIM-1A layers 129 and 133 result in reductions to their cooling capabilities. Consequently, the typical 3D IHS solution merely transfers the problem associated with BLTs of the TIM-1 layers to the BLTs of the TIM-1A layers.

Furthermore, the Cu foils 127 and 131 generally need to be several times larger in the x-y dimensions than the components 123 and 124. Thus, the typical 3D IHS solution is limited because it needs keep-out zones with large x-y dimensions to dissipate unwanted heat.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Embodiments described herein provide methods, systems, and apparatuses that can assist with improving integrated heat spreader (IHS) solutions for semiconductor packages, such as multi-chip packages (MCPs).

For one aspect, embodiments integrate a multi-reference integrated heat spreader (IHS) solution or a smart IHS solution into an MCP to improve heat dissipation of unwanted heat produced by one or more components of an MCP.

For one embodiment, a "multi-reference integrated heat spreader solution," a "multi-reference IHS solution," a "smart integrated heat spreader solution," a "smart IHS solution," and their variations refer to an architectural solution that includes each of the following components: (i) a smart IHS lid formed from a thermally conductive material, where the smart IHS lid has at least one cavity formed in a central region of the smart IHS lid; (ii) at least one TIM-layer 1 to be on at least one component of a semiconductor package (e.g., an MCP, etc.); (iii) at least one individual IHS lid (IHS slug) formed from a thermally conductive material to be on the at least one TIM-1 layer and inserted into the at least one cavity of the smart IHS lid; and (iv) at least one TIM-1A layer to be on the at least one IHS slug and/or layered in the at least one cavity of the smart IHS lid. For an alternate embodiment, the smart IHS solution includes at least one of the components described above. For one embodiment, the smart IHS solution is a heat exchanger that transfers heat from a heat source (e.g., one or more components of a semiconductor package (e.g., an MCP, etc.)) to a secondary heat exchanger (e.g., a heat sink, an ambient environment, etc.). For one embodiment, sidewalls of a cavity formed in the smart IHS lid surround sidewalls of an IHS slug on a TIM-1 layer such that at least one portion of the IHS slug is inserted in the cavity. Furthermore, and for one embodiment of a smart IHS solution, a TIM-1A layer is between a cavity of the smart IHS lid and an IHS slug inserted into the cavity.

Figure 1A:
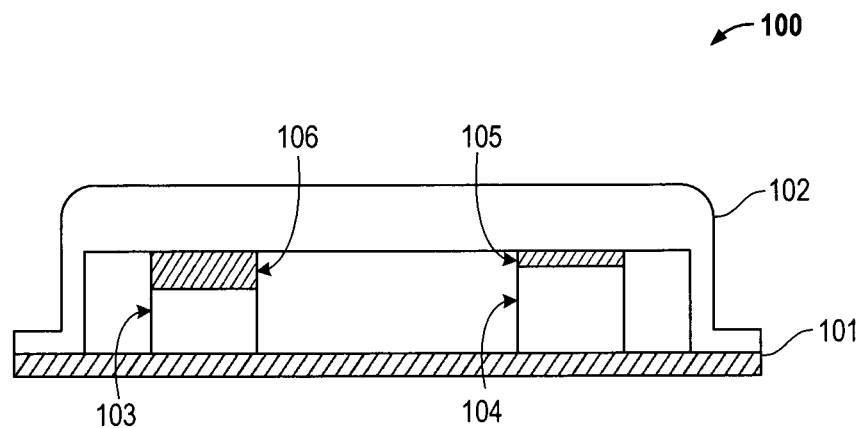
FIG. 1A is a cross-sectional view of a typical MCP that includes a typical integrated heat spreader (IHS) solution.
Figure 1B:
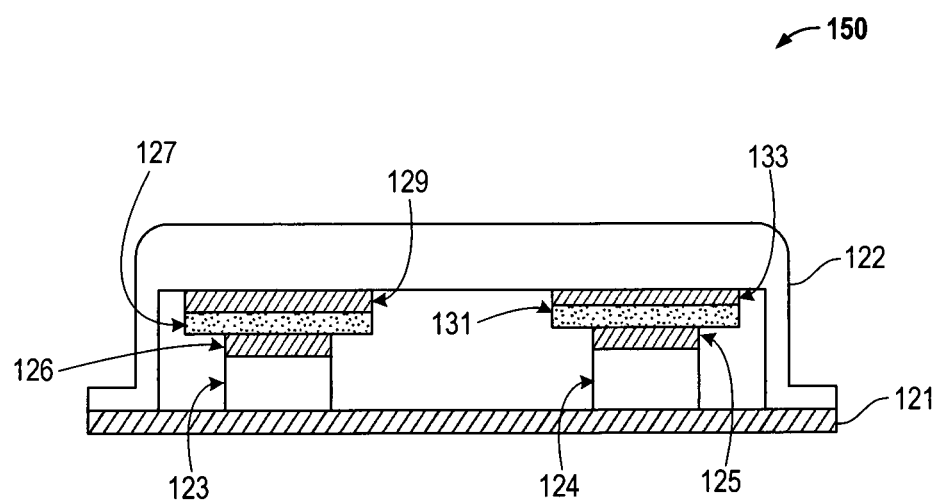
FIG. 1B is a cross-sectional view of a typical MCP that includes a typical three-dimensional (3D) IHS solution.

Use of a smart IHS solution can assist with dissipation of unwanted heat produced by one or more components of a semiconductor package (e.g., an MCP, etc.) in the following ways: (i) the IHS slugs can assist with mitigating the impact of power non-uniformity affecting the components of the package; (ii) the use of a TIM-1A layer between at least one cavity of the smart IHS lid and at least one IHS slug can assist with coupling heat from the IHS slug through the TIM-1A-layer, which can in turn increase the area of heat transfer; (iii) the combination of the smart IHS lid and at least one IHS slug can be designed to have a minimum overlap area and thermal performance, which can effectively mitigate bond line thickness (BLT) variation; (iv) the smart IHS solution may be able to assist with increasing performance of a semiconductor package (e.g., an MCP, etc.) (as compared with the typical IHS solutions described above in connection with FIGS. 1A-1B); (v) the smart IHS solution can be used with dense package architectures that require tight pitches between package components; (v) the smart IHS solution can be used with currently available manufacturing techniques, which can assist with reducing manufacturing costs; and (vii) the smart IHS solution can leverage current and/or future improvements in materials because the smart IHS solution is an architectural solution (as opposed to a material-based solution).

For one embodiment, a semiconductor package includes a component on a substrate. For one embodiment, the package includes at least one semiconductor die and a smart integrated heat spreader (IHS) solution. For a further embodiment, the smart IHS solution includes a smart IHS lid. For one embodiment, the smart IHS lid includes a cavity formed in a central region of the smart lid. For one embodiment, the smart IHS lid is on the component, such that the cavity corresponds to the component. For one embodiment, the smart IHS solution also includes a first thermal interface material layer (TIM-layer 1) on the component. For a further embodiment, the smart IHS solution also includes an individual IHS lid (IHS slug) on the TIM-1 layer. For an even further embodiment, the IHS slug is inserted into the cavity of the smart IHS lid, where sidewalls of the cavity surround at least some portion of the sidewalls of the IHS slug. For one embodiment, the smart IHS solution includes an intermediate thermal interface material layer (TIM-1A layer) that is between the IHS slug and cavity of the smart IHS lid.

For one embodiment, the TIM-1A layer is formed in the cavity of the smart IHS solution before the IHS slug is inserted into the cavity of the smart IHS lid. For an alternate embodiment, the TIM-1A layer is on IHS slug before the IHS slug is inserted in the cavity of the smart IHS lid. The TIM-1A layer can include least one of a polymeric thermal interface material (PTIM), an epoxy, a liquid phase sintering (LPS) paste, or a solder paste. For one embodiment, the smart IHS lid is coupled to the IHS slug. For example, the smart IHS lid is at least one of thermally coupled or mechanically coupled to the IHS slug. In addition, the smart IHS lid can be mechanically coupled to the substrate with a sealant.

The package can include a heat sink on the smart IHS lid, where the heat sink is coupled to the smart IHS lid with a second thermal interface material (TIM-2) layer on the smart IHS lid between the heat sink and the smart IHS lid. For example, the heat sink is at least one of thermally coupled or mechanically coupled to the smart IHS lid.

Figure 2A:
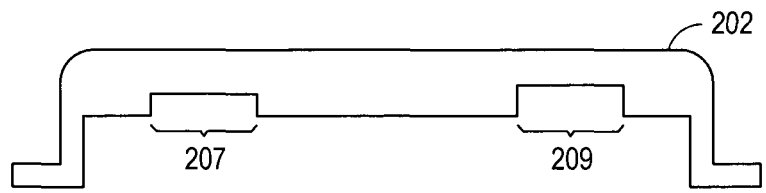
FIGS. 2A-2B illustrate cross-section side views of a smart IHS lid, in accordance with at least one embodiment.
Figure 2B:
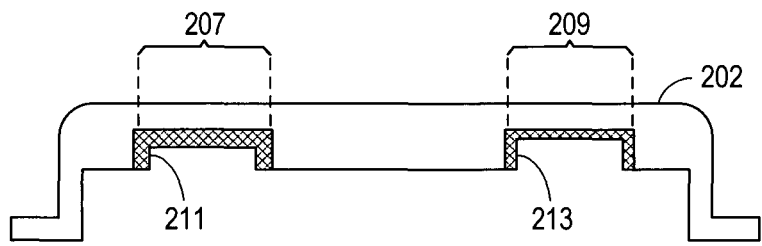

FIGS. 2A-2B illustrate cross-section side views of a smart IHS lid 202, in accordance with at least one embodiment. Referring to FIG. 2A, which shows the smart IHS lid 202 with at least one cavity formed in a central region of the smart IHS lid 202. For the specific embodiment illustrated in FIG. 2A, the smart IHS lid 202 includes two cavities 207 and 209 formed in a central region of the smart IHS lid 202. It is to be appreciated that embodiments of the smart IHS lid described herein can include one or more cavities—e.g., the smart IHS lid 232 described below in connection with FIG. 2D includes only one cavity.

The smart IHS lid 202 can be formed from a thermally conductive material, such as metal. For example, the smart IHS lid 202 can be formed from at least one of copper, aluminum, steel, nickel, any other metal, a metal alloy, any other conductive material, or any combination thereof. Each of the cavities 207 and 209 can be formed using techniques known in the art. For example, forming the cavities 207 and 209 includes mechanically cutting the cavities using at least one of laser drilling, etching, forging, stamping, or die-casting as known in the art. Each of the cavities 207 and 209 can have a square, rectangular, round, oval, or any other shape that corresponds to an underlying component of a semiconductor package (not shown in FIGS. 2A-2B). For each of the cavities 207 and 209 in the smart IHS lid 202, its size is greater than a size of an underlying component of a semiconductor package (e.g., an MCP, etc.) (not shown in FIGS. 2A-2B). For some embodiments, a z-height of each of the cavities 207 and 209 is less than or equal to 2000 µm. For one embodiment, a width and a length (i.e., the x-y dimensions) of each of the cavities 207 and 209 are greater than a width and a length of an underlying component of a semiconductor package (e.g., an MCP, etc.) (not shown in FIGS. 2A-2B). For one embodiment, each of the cavities 207 and 209 in the smart IHS lid 202 is centered over the component. For a further embodiment, the thickness of the smart IHS lid 202 is greater than the heights of each of the cavities 207 and 209. For some embodiments, the thickness of the smart IHS solution is greater than 2000 µm.

Referring to FIG. 2B, the cavity 207 includes an intermediate level thermal interface material (TIM-1A) layer 211 formed on each wall of the cavity 207 and the cavity 209 includes a TIM-1A layer 213 formed on each wall of the cavity 209. For some embodiments, the layering of the cavities 207 and 209 of the smart IHS lid 202 with the TIM-1A layers 211 and 213, respectively, can assist with dissipating heat from components of semiconductor package (not shown in FIGS. 2A-2B), which can in turn assist with increasing the area of heat transfer to maximize heat dissipation from the semiconductor package. As shown in FIG. 2B, a top wall of the cavity 207 that is parallel (or co-planar) with a top of the smart IHS lid 202 has a TIM-1A layer 211 with a z-height that ranges between 50 µm and 450 µm. Moreover, a top wall of the cavity 209 that is parallel (or co-planar) with a top of the smart IHS lid 202 has a TIM-1A layer 213 with a z-height that ranges between 50 µm and 450 µm. For one embodiment, a thickness or bond line thickness (BLT) of the TIM-1A layer 211 can be different from a thickness or BLT of the TIM-1A layer 213. For another embodiment, a thickness or BLT of the TIM-1A layer 211 can be equal or substantially equal to a thickness or BLT of the TIM-1A layer 213.

For one embodiment, the TIM-1A layers 211 and 213 are deposited into the respective cavities 207 and 209. For this embodiment, the deposited TIM-1A layers 211 and 213 are cured and/or baked to adhere the TIM-1A layers 211 and 213 to the walls of the cavities 207 and 209. For an alternate embodiment, the TIM-1A layers 211 and 213 are each deposited into the respective cavities 207 and 209 without curing and/or baking. For this alternate embodiment, the TIM-1A layers 211 and 213 adhere to the walls of the cavities 207 and 209 due to the properties (e.g., chemical properties, mechanical properties, magnetic properties, etc.) of the TIM(s) used for forming the TIM-1A layers 211 and 213.

For one embodiment, each TIM used for forming the TIM-1A layers 211 and 213 is a material that exhibits high thermal conductivity—for example, copper, silver, gold, beryllium oxide, aluminum, tungsten, zinc, brass, and any other material or combination of materials known in the art to exhibit high thermal conductivity. For one embodiment, the thermal conductivity of each of TIM-1A layers 211 and 213 ranges from 2 watts per meter kelvin (W/mK) to 30 W/mK. For a further embodiment, each of the TIM-1A layers 211 and 213 includes at least one of a polymeric thermal interface material (PTIM) with a thermal conductivity that ranges from 2 W/mK to 7 W/mK, an epoxy with a thermal conductivity that ranges from 10 W/mK to 20 W/mK, a liquid phase sintering (LPS) paste with a thermal conductivity that ranges from 5 W/mK to 15 W/mK, or a solder paste with a thermal conductivity that ranges from 10 W/mK to 30 W/mK.

Figure 2C:
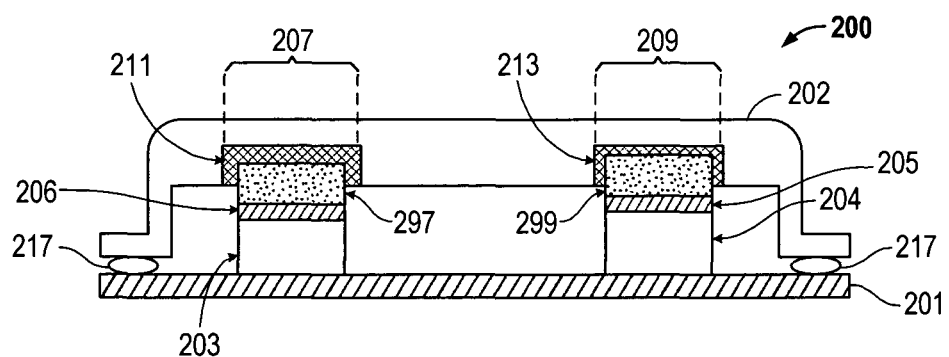
FIG. 2C illustrates a cross-section side view of a semiconductor package including a multi-reference integrated heat spreader (IHS) solution or a smart IHS solution, in accordance with an embodiment.

FIG. 2C illustrates a cross-section side view of a semiconductor package 200 including a smart IHS solution, in accordance with at least one embodiment. The package 200 can be a multi-chip package (MCP). It is to be appreciated that the package 200 does not have to be a MCP package—for example, the package 200 can be a single-chip package. The smart IHS lid 202 described below in connection with FIG. 2C is similar to or the same as the smart IHS lid 202 described above in connection with at least one of FIGS. 2A-2B.

Referring to FIG. 2C, one embodiment of the package 200 includes the following: (i) a substrate 201; (ii) a component 203; (iii) a component 204; (iv) a first level thermal interface material (TIM-1) layer 205 on the component 204; (v) a TIM-1 layer 206 on the component 203; (vi) a smart IHS lid 202 that includes cavities 207 and 209; (vii) an individual IHS lid (IHS slug) 297 on the TIM-1 layer 206; (viii) an IHS slug 299 on the TIM-1 layer 205; (ix) an intermediate level thermal interface material (TIM-1A) layer 211 between the cavity 207 and the IHS slug 297; (x) a TIM-1A layer 213 between the cavity 209 and the IHS slug 299; and (xi) a sealant 217.

As shown in FIG. 2C, the package 200 can include multiple components, such as the components 203 and 204, on a substrate 201. The components 203 and 204 can be adjacent to each other and can be spaced apart from each other on substrate 201. The components 203 and 204 can be any one of active and passive electronic device components—e.g., transistors, memories, capacitors, resistors, optoelectronic devices, switches, interconnects, and any other electronic device components. For one embodiment, at least one of the components 203 and 204 includes a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof.

The components 203 and 204 can have different z-heights relative to the surface of the substrate 201. For one embodiment, the z-height of the components 203 and 204 on the substrate 201 is from 400 μm to 1170 μm. For a specific embodiment, the components 203 and 204 each include at least one die that has a z-height of at least 770 μm. For one embodiment, a height difference between the components 203 and 204 is at least 400 μm. The height variation affecting the components 203 and 204 can be attributable to one or more causes, as described above in connection with FIGS. 1A-1B.

For one embodiment, the components 203 and 204 include a semiconductor die. For some embodiments, at least one of the components 203 and 204 is a non-stacked die component. For other embodiment, at least one of the components 203 and 204 is a stacked die component. For some embodiments, at least one of the components 203 and 204 is a die block. Each die block can be a stacked die package or non-stacked die package. For one embodiment, the components 203 and 204 are manufactured using the same or similar manufacturing processes. For one embodiment, the components 203 and 204 are manufactured using different manufacturing processes. For one embodiment, the components 203 and 204 are similar to or the same as each other—e.g., each of components 203 and 204 is a die that is directly attached to the substrate 201. For an alternate embodiment, the components 203 and 204 are different from each other—e.g., the component 203 can be a non-stacked die package, while the component 204 is a stacked die package. For some embodiments, at least one of the components 203 and 204 is attached to the substrate 201 via any attachment mechanisms or techniques known in the art—e.g., a BGA substrate.

Although FIG. 2C illustrates the package 200 as having only two components (i.e., the components 203 and 204), the number of components on the package 200 can be at least one component. Generally, a die in the context of integrated circuits is a small block of semiconducting material, on which a functional circuit is fabricated. Typically, integrated circuits are produced on a wafer of electronic-grade silicon or other semiconductor, for example, Gallium Arsenide ("GaAs") using one of photolithography techniques known in the art.

The wafer is typically cut ("diced") into many pieces, each containing a copy of the circuit. Each of these pieces can be called a die or a chip. The die can be mounted on a substrate, such as substrate 201, using different techniques known in the art. For example, mounting die on the substrate 201 can be performed using wire bonding, a flip-chip connection, and any other technique known in the art. The die can be directly attached to the substrate using any technique known in the art. For one embodiment, the substrate 201 is a laminated substrate at a bottom side of an electronic device package. The substrate 201 can have conductive traces that route and connect, for example, the die-to-substrate bonds to the substrate-to-ball array bonds.

For one embodiment, the substrate 201 includes an organic core, resin, filler material, copper, solder epoxy underfill, solder, or a combination thereof. For some embodiments, the substrate 201 is a ceramic substrate. For other embodiments, the substrate 201 includes a semiconductor material—for example, monocrystalline silicon ("Si"), germanium ("Ge"), silicon germanium ("SiGe"), a III-V material (such as gallium arsenide ("GaAs")), or any combination thereof. For one embodiment, the substrate 201 includes metallization interconnect layers for integrated circuits. The substrate 201 can include electronic devices—for example, transistors, memories, capacitors, resistors, optoelectronic devices, switches, and any other active and passive electronic devices that are separated by an electrically insulating layer. The insulating layer can be an inter-layer dielectric, a trench insulation layer, or any other insulating layer known in the art of the electronic device manufacturing. For some embodiments, the substrate 201 includes interconnects—for example, one or more vias configured to connect metallization layers.

The package 200 can include a TIM-1 layer on each of the components. Specifically, a TIM-1 layer 206 is on the component 203 and a TIM-1 layer 205 is on the component 204. Thermal interface materials (TIMs) are used to facilitate thermal conduction from a component (e.g., components 203 and/or 204) to a secondary heat exchanger (e.g., a heat sink, an ambient environment, other secondary heat exchangers, etc.). TIMs can assist with minimizing interface thermal resistance. Each of the TIM-1 layers 205 and 206 can be at least one of a high thermal conductivity adhesive material or a metallic alloy. Thus, the TIMs used to form the TIM-1 layers 205 and 206 are typically high thermal conductivity materials that become liquidous or near-liquidous at predetermined operating temperatures. The TIMs can flow and fill surface asperities enabling reductions in thermal resistance between two contacting surfaces. The TIMs used to make at least one of the TIM-1 layers 205 or 206 can be at least one of a metal based TIM, a polymer matrix TIM, thermal grease, or any other TIM-1 material layer known in the art. At least one of the TIM-1 layers 205 or 206 can be a metallic alloy with a low melting point. At least one of the TIM-1 layers 205 or 206 can be a solder thermal interface material ("STIM"), such as an indium solder TIM. For one embodiment, each of the TIM-1 layers 205 and 206 is 99.99% indium solder. For one embodiment, at least one of the TIM-1 layers 205 or 206 is a metal based alloy layer. For example, one or both of the TIM-1 layers 205 and 206 includes at least one of indium, tin, lead, silver, antimony, bismuth, zinc, cadmium, gold, copper, ruthenium, nickel, cobalt, chromium, iron, manganese, titanium, aluminum, hafnium, tantalum, tungsten, vanadium, molybdenum, palladium, platinum, or any combination thereof.

For some embodiments, the TIM-1 layers 205 and 206 are deposited on the components 204 and 203, respectively. Deposition of TIM-1 layers can be performed using any techniques known in the art. For one embodiment, a thickness or BLT of the TIM-1 layer 205 can be different from a thickness or BLT of the TIM-1 layer 206. For another embodiment, a thickness or BLT of the TIM-1 layer 205 can be equal or substantially equal to a thickness or BLT of the TIM-1 layer 206. For one embodiment, the TIM-1 layers 205 and 206 have a single predetermined BLT. For a further embodiment, the minimum thickness of each of the TIM-1 layers 205 and 206 is less than 50 μm. For some embodiments, the thickness of the each of the TIM-1 layers 205 and 206 is from about 20 μm to about 50 μm. For an embodiment, each of the TIM-1 layers 205 and 206 is a TIM-1 preform that has a predetermined shape adjusted to a shape of die(s) on the components 203 and 204, respectively. The TIM-1 preform can be placed on the top surface of any one of the components 203 and 204 using, for example, a vacuum tool. The TIM-1 preform can be manufactured using one of techniques known in the art—e.g., by stamping, etc.

For one embodiment, the TIM-1 preform is placed on the die using any suitable tool known in the art.

The package 200 can also include a plurality of individual IHS lids (IHS slugs) 297 and 299 on the TIM-1 layers 206 and 205, respectively. For one embodiment, the IHS slugs 297 and 299 are deposited on the TIM-1 layers 206 and 205, respectively. For one embodiment, a thickness of the IHS slug 297 in the z-direction can be different from a thickness of the IHS slug 299 in the z-direction. For another embodiment, a thickness of the IHS slug 297 in the z-direction can be equal or substantially equal to a thickness of the IHS slug 299 in the z-direction.

For one embodiment, the IHS slug 297 has x-y dimensions (i.e., length and width) that are at least the same as x-y dimensions (i.e., length and width) of the component 203 and the IHS slug 299 has x-y dimensions that are at least the same as x-y dimensions of the component 204. For example, the IHS slug 297 has the same length and the same width as the component 203, which can be a die or a die stack. For one embodiment, each of IHS slug 297 and IHS slug 299 has a height (i.e., z-height) that less than or equal to 2000 μm. For yet another embodiment, each of IHS slug 297 and IHS slug 299 has a height (i.e., z-height) that ranges from 500 μm to 2000 μm. For another embodiment, the IHS slug 297 has x-y dimensions (i.e., length and width) that are larger than the x-y dimensions (i.e., length and width) of the component 203 and the IHS slug 299 has x-y dimensions that are larger than the x-y dimensions of the component 204.

As shown in FIG. 2C, the IHS slugs 297 and 299 are included in the package 200 to dissipate heat generated by the components 203 and 204, respectively. This can assist with mitigating the impact of power non-uniformity in the die(s) of the component 203 and the die(s) of the component 204. For some embodiments, each of the IHS slugs 297 and 299 is a copper plate, aluminum plate, any other plate made from a highly thermally conductive material, or a combination thereof. For some embodiments, each of the IHS slugs 297 and 299 has an area size adjusted to the size of its respective component. For example, the IHS slug 297 has a size adjusted to the size of component 203. The IHS slugs 297 and 299 can have a square, rectangular, round, oval, or any other shape that corresponds to the underlying components 203 and 204, respectively. Each of the IHS slugs 297 and 299 can act as a first heat exchanger that moves heat between a heat source (e.g., components 203 and 204) and the smart IHS lid 202, whose larger surface area and geometry are more adapted to remove overall heat from the package 200. The heat produced by a heat source (e.g., component 203 and 204) is "spread out" by the IHS slugs 297 and 299 allowing the smart IHS lid 202 to increase the heat capacity of the package 200.

Referring still to FIG. 2C, the package 200 can also include a smart IHS lid 202 that includes the cavities 207 and 209, where the TIM-1A layer 211 is between the cavity 207 and the IHS slug 297 and where the TIM-1A layer 213 is between the cavity 209 and the IHS slug 299. The smart IHS lid 202 of FIG. 2C is similar to or the same as the smart 202 described above in connection with FIG. 2B. One of the advantages of the smart IHS lid 202 can be seen from a comparison of the smart IHS lid 202 with a presently available IHS lid, such as the IHS lid 102 or the IHS 122 described above in connection with FIGS. 1A-1B. Component variability in a semiconductor package can increase bond line thickness (BLT) of the TIM-1 layers used to couple a presently available IHS lid (e.g., the IHS lid 102 or the IHS lid 122) to components of a semiconductor package. This may cause an increase in the thermal resistance of the TIM-1 layers as the thickness of the TIM layer 116 increases. As such, a thinner TIM-1 layer, such as the TIM-1 layers 205 and 206 that have fixed z-heights, may more effectively dissipate heat from components of a semiconductor package. In addition to added thermal resistance due to additional thickness of TIM-1 layers, the variability of the required thickness of the TIM-1 layer limits the choice of materials. For instance, many pad type TIM-1 layer materials may not be sufficiently compressible to accommodate the required dimensional variability. Additionally, some thermal grease materials may lack the thermal conductivity required, particularly where the x-y dimensions require relatively thick TIM-1 layers.

One or more embodiments of the smart IHS lid 202 described herein can assist with reducing or mitigating some of the issues associated with presently available IHS lids. For one embodiment, the smart IHS lid 202 is used in combination with the IHS slugs 297 and 299 to assist with improved heat dissipation from the components 203 and 204, when the cavities 207 and 209 of the smart IHS lid 202 are filled with the TIM-1A layers 211 and 213. The following description explains how the smart IHS lid 202, the IHS slugs 297 and 299, the cavities 207 and 209, and the TIM-1A layers 211 and 213 can be used to provide one or more of the advantages described herein. For the sake of brevity, only the IHS slug 297, the cavity 207, and the TIM-1A layer 211 will be described. It is to be appreciated that the following description also applies to the IHS slug 299, the cavity 209, and the TIM-1A layer 213.

Referring still to FIG. 2C, the IHS slug 297 can be inserted into the cavity 207 such that the TIM-1A layer 211 encapsulates the IHS slug 297. Stated differently, and for one embodiment, the sidewalls of the cavity 211 surround the sidewalls of the IHS slug 297 such that at least one portion of the IHS slug 297 is inserted in the cavity 207. In this way, the cavity 207 enables existence of some overlap between the smart IHS lid 202 and the IHS slug 297. For one embodiment, an x-dimension, a y-dimension, or a z-dimension of the cavity 207 is larger than a corresponding x-dimension, a corresponding y-dimension, or a corresponding z-dimension of the IHS slug 297 to enable the IHS slug 297 to be inserted into the cavity 207 such that the TIM-1A layer 211 encapsulates the IHS slug 297. For a first example, the cavity 207 has x-y dimensions that are larger than x-y dimensions of the of the IHS slug 297 to enable the IHS slug 297 to be inserted into the cavity 207 such that the TIM-1A layer 211 encapsulates the IHS slug 297. For a second example, the cavity 207 has a z-dimension that is larger than a z-dimension of the of the IHS slug 297 to enable the IHS slug 297 to be inserted into the cavity 207 such that the TIM-1A layer 211 encapsulates the IHS slug 297.

As shown in FIG. 2C, the TIM-1A layer 211 encapsulates the IHS slug 297. As used herein, "encapsulating" and its variations do not require all surfaces of an IHS slug to be encased within a TIM-1A layer. For one embodiment, the encapsulation of IHS slug 297 by the TIM-1A layer 211 enables heat dissipation through the TIM-1A layer 211 to be improved. Furthermore, this encapsulation can enable any variation in the z-height of component 203 to be absorbed by at least one of the IHS slug 297 or the TIM-1A layer 211. For example, if the cavity 207 has fixed z-height of 2000 μm, the TIM-1 layer 206 has a fixed z-height of 50 μm and the component 203 has a variable z-height of 400 μm to 1170 μm, then the IHS slug 297 can have a variable z-height of 500 μm to 2000 μm or the TIM-1A layer 207 can have a variable z-height of 50 μm to 450 μm. Thus, any variations in the z-height of the component 203 can be absorbed by adjusting at least one of the z-height of IHS slug 297 or the z-height of the TIM-1A layer 211. The overlap created by placing the IHS slug 297 inside the cavity 207 can assist with reducing at least one of the BLT of the TIM-1 layer 206 or the BLT of the TIM-1A layer 211, which can in turn assist with minimizing interface thermal resistance, which can further assist with improving heat dissipation by the smart IHS solution shown in FIG. 2C. For one embodiment, the encapsulation of IHS slug 297 by the TIM-1A layer 211 enables any variation in the z-height of component 203 to be absorbed by the TIM-1A layer 211 without being absorbed by the IHS slug 297. For another embodiment, the encapsulation of IHS slug 297 by the TIM-1A layer 211 enables any variation in the z-height of component 203 to be absorbed by the IHS slug 297 without being absorbed by the TIM-1A layer 211.

For one embodiment, and with regard to FIG. 2C, when the IHS slugs 297 and 299 are transferred onto the TIM-1 layers 206 and 205, respectively, a force is applied to ensure that the bond line thickness (BLT) of each of the TIM-1 layers 206 and 205 is minimized. This application of a force can assist with ensuring a minimum BLT of each of the TIM-1 layers 206 and 205 (which assist with making the thickness of the lower thermal conductivity TIM as low as possible and with lowering overall thermal resistance). For one embodiment, and with regard to FIG. 2C, when the smart IHS lid 202 is transferred onto the IHS slugs 297 and 299, a force is applied to the smart IHS lid 202 to ensure that the BLT of each of the TIM-1A layers 207 and 209 is minimized. This application of a force can assist with ensuring a minimum BLT of each of the TIM-1A layers 207 and 209 (which assist with making the thickness of the lower thermal conductivity TIM as low as possible and with lowering overall thermal resistance).

The smart IHS lid 202 can be coupled to the substrate 201 via a sealant 217. For one embodiment, the sealant 217 is dispensed at the perimeter of the smart IHS lid 202, with a contact area limited by the area of the footprint (in the x-y dimensions) of the smart IHS lid 202. The size of this footprint area and its location are driven by package design considerations such as, but not limited to, locations of the components 203 and 204 and the size of the substrate 201. For some embodiments, the sealant 217 may provide some level of thermal coupling between the smart IHS lid 202 and the substrate 201; however, the primary purpose of the sealant 217 is to provide a structural or mechanical connection between the smart IHS lid 202 and the substrate 201. The sealant 217 can be a seal adhesive material that is a thermally conductive material. Thermally conductive materials are known in the art. The sealant 217 can also be made from silicone- or epoxy-based sealant materials, as is known in the art. For one embodiment, clips and/or sealant-adhesives can be used as the sealant 217 to adhere the smart IHS lid 202 to the substrate 201.

Figure 2D:
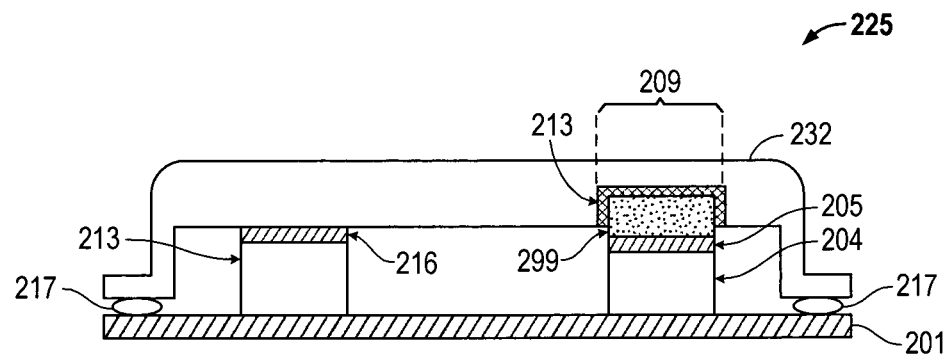
FIG. 2D illustrates a cross-section side view of a semiconductor package including a smart IHS solution, in accordance with another embodiment.

FIG. 2D illustrates a cross-section side view of a semiconductor package 225 including a smart IHS solution, in accordance with one embodiment. The package 225 shown in FIG. 2D is similar to the package 200 described above in connection with FIG. 2C. For the sake of brevity, only the differences between the package 225 and the package 200 will be described below in connection with FIG. 2D.

The smart IHS solution of the package 225 includes a smart IHS lid 232, a component 213, and a TIM-1 layer 216. The smart IHS lid 232 can be similar to the smart IHS lid 202 described above in connection with at least one of FIGS. 2A-2C. For one embodiment, and as illustrated in FIG. 2D, the smart IHS lid 232 includes only one cavity 209, which is also described above in connection with at least one of FIGS. 2A-2C. In the package 225, the component 213 is similar to the component 203 described above in connection with FIG. 2C; however, the component 213 has a z-height that is larger the component 204 (which is described above in connection with FIG. 2C).

As shown in FIG. 2D, a TIM-1 layer 216 is deposited on the component 213. The TIM-1 layer 216 is similar to the TIM-1 layer 206 described above in connection with FIG. 2C; however, the TIM-1 layer 216 is on the component 213 to couple the smart IHS lid 232 to the component 213. For example, the smart IHS lid 232 is at least one of thermally coupled or mechanically coupled to the component 213.

For some embodiments, the TIM-1 layer 216 and the TIM-1 layer 205 (described above in connection with FIG. 2C) are deposited on the components 213 and 204, respectively. Deposition of TIM-1 layers can be performed using any techniques known in the art. For one embodiment, a thickness or BLT of the TIM-1 layer 216 is equal or substantially equal to a thickness or BLT of the TIM-1 layer 205. For another embodiment, a thickness or BLT of the TIM-1 layer 216 is different from a thickness or BLT of the TIM-1 layer 205. For one embodiment, the TIM-1 layers 216 and 205 have a single predetermined BLT. For an embodiment, the minimum thickness of each of the TIM-1 layers 216 and 205 is less than 50 μm. For some embodiments, the thickness of the each of the TIM-1 layers 216 and 205 is from about 20 μm to about 50 μm. For an embodiment, each of the TIM-1 layers 216 and 205 is a TIM-1 preform that has a predetermined shape adjusted to a shape of die(s) on the components 213 and 204, respectively. The TIM-1 preform can be placed on the top surface of any one of the components 216 and 205 using, for example, a vacuum tool. The TIM-1 preform can be manufactured using one of techniques known in the art—e.g., by stamping. For one embodiment, the TIM-1 preform is placed on the die using any suitable tool known in the art.

The smart IHS solution of the package 225 shows that the z-height variation resulting from the different z-heights of the components 213 and 204 can use at least one cavity (e.g., cavity 209) to resolve the z-height variation affecting the components of a package. Thus, for some embodiments, a package (e.g., packages 225) can include one or more embodiments of the smart IHS solution for some of its components (e.g., component 204), while using other architectural solutions (e.g., only a TIM-1 layer 216) for other components (e.g., component 213). Consequently, embodiments of the smart IHS solution described herein can be combined other IHS solutions, as is needed—for example, the smart IHS solution shown in FIG. 2C or 2D can be combined with a typical IHS solution, such as any of the typical IHS solutions described above in connection with at least one of FIGS. 1A-1B. It is to be appreciated that combinations with other IHS solutions that are not described herein are also possible.

Figure 2E:
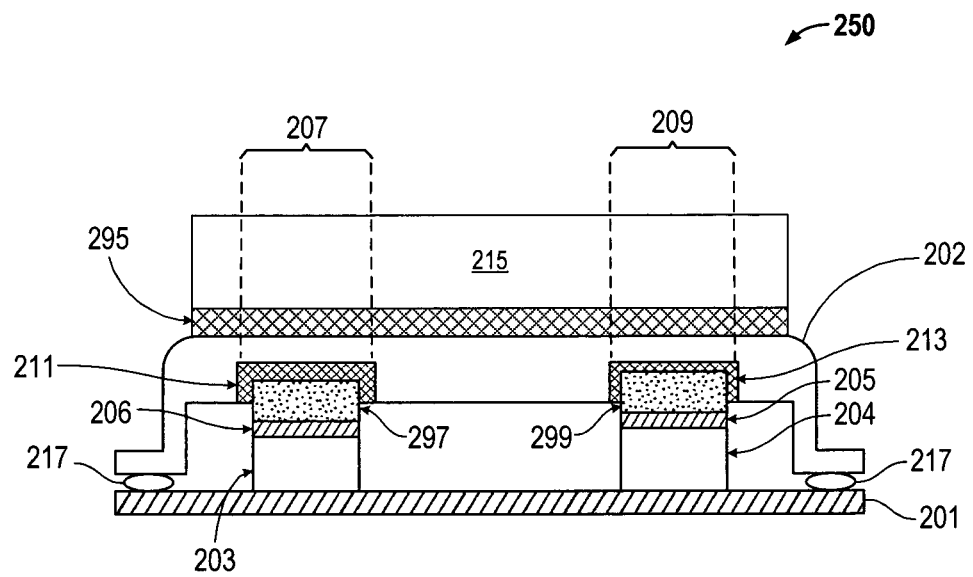
FIG. 2E illustrates a cross-section side view of a semiconductor package including a smart IHS solution and a heat sink, in accordance with at least one embodiment.

Referring now to FIG. 2E, a cross-section side view of a semiconductor package 250 including a smart IHS solution and a heat sink 215 are illustrated, in accordance with some embodiments. The smart IHS solution shown in FIG. 2E is similar to or the same as the smart IHS solution described above in connection with at least one of FIG. 2C or 2D. For one embodiment, the package 250 is similar to or the same as at least one of the packages described above in connection with at least one of FIG. 2C or 2D. For brevity, only the differences between the package 250 and the packages shown in FIGS. 2C-2D are described below in connection with FIG. 2E.

One difference between the package 250 and the packages shown in FIGS. 2C-2D is that the package 250 includes a heat sink 215 and a second thermal interface material (TIM-2) layer 295, as shown in FIG. 2E. For one embodiment, the heat sink 215 is coupled to the smart IHS lid 202 via the TIM-2 layer 295. For example, the heat sink 215 is at least one of thermally coupled or mechanically coupled to the smart IHS lid 202. For an embodiment, and with regard to FIG. 2E, when the heat sink 215 is transferred onto the smart IHS lid 202, a force is applied to the heat sink 215 to ensure that the BLT of the TIM-2 layer 295 is minimized. This application of a force can assist with ensuring a minimum BLT of the TIM-2 layer 295 (which assist with making the thickness of the lower thermal conductivity TIM as low as possible and with lowering overall thermal resistance).

The heat sink 215 dissipates heat further away from the components 203 and 204 connected to the smart IHS lid 202 through, for example, conduction, convection, and/or radiation. A thermal mass of the heat sink 215 is typically greater than the thermal mass of the components 203 and 204 and the smart IHS lid 202. The heat sink 215 is typically made of a high thermally conductive material—for example, copper, aluminum, other thermally conductive metals, or any combination thereof. For one embodiment, the heat sink 215 is mounted on the smart IHS lid 202 to provide thermal contact to semiconductor die(s) of components 203 and/or 204.

For each of FIGS. 2C-2E, and for one embodiment, thermal interface material (TIMs) used to form the TIM-1 layers 205 and 206, TIMs used to form the TIM-1A layers 211 and 213, TIMs used to form the TIM-2 layer 295, and any other materials used to assembly the MPS 200 or the MPS 300 are cured or baked in an oven to adhere to the respective layers to a respective one of the components 203 and 205, the IHS slugs 297 and 299, and the smart IHS lid 202. For some embodiments, the baking temperature is from about 150° C. to about 200° C.

Figure 3:
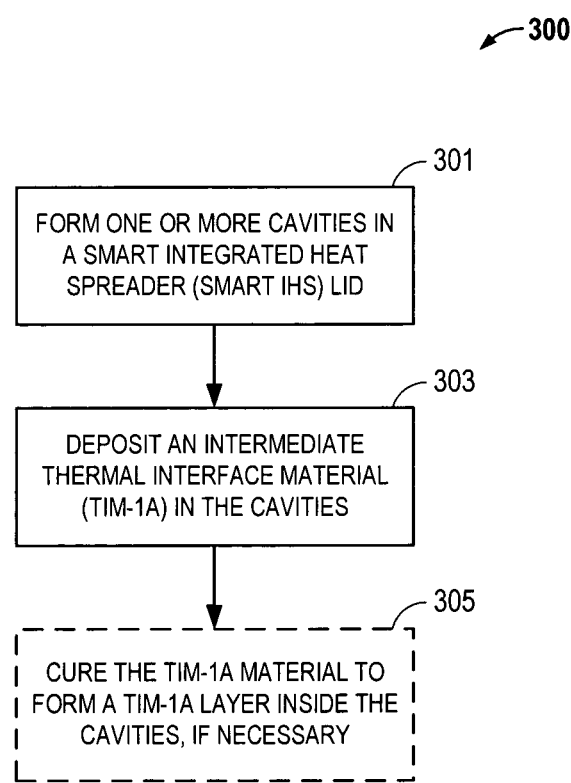
FIG. 3 is a process flow illustration of a method of forming a smart IHS lid, in accordance with one embodiment.

FIG. 3 is a process flow illustration of a method 300 of forming a smart IHS lid according to one embodiment. For one embodiment, process 300 begins at block 301 where one or more cavities are formed in a smart IHS lid. For one embodiment, the one or more cavities of the smart IHS lid are formed in accordance with the description provided above in connection with at least one of FIG. 2A or 2B.

At block 303, a TIM-1A material is deposited in each of the one or more cavities of the smart IHS lid to form a TIM-1A layer inside each of the cavities. For one embodiment, deposition of the TIM-1A material is performed using deposition techniques known in the art. For one embodiment, the TIM-1A material includes at least one of a polymeric thermal interface material (PTIM) with a thermal conductivity that ranges from 2 W/mK to 7 W/mK, an epoxy with a thermal conductivity that ranges from 10 W/mK to 20 W/mK, a liquid phase sintering (LPS) paste with a thermal conductivity that ranges from 5 W/mK to 15 W/mK, or a solder paste with a thermal conductivity that ranges from 10 W/mK to 30 W/mK. For example, the TIM-1A material that is deposited in the cavities is a next-generation polymer thermal interface material (NGPTIM) with a thermal conductivity that ranges from 2 W/mK to 7 W/mK. For one embodiment, the TIM-1A layer is formed in accordance with at least one of the descriptions provided above in connection with FIGS. 2A-2D.

Process 300 proceeds to optional block 305 where the deposited TIM-1A layer is cured or baked to adhere the TIM-1A layer to the walls of each of the cavities if necessary. As explained above in connection with FIGS. 2A-2B, curing and/or baking is not always necessary because the TIM used to form the TIM-1A layer in the one or more cavities may have properties that enable the TIM-1A layer to be formed without curing and/or baking. For one embodiment, the TIM-1A layer acts as an interface that does not require the compliance of an IHS slug encapsulated by the TIM-1A layer. For one embodiment, the key characteristic for the TIM-1A layer of the smart IHS solution is high thermal conductivity. For a further embodiment, the material used to form the TIM-1A layer ensures compatibility with downstream thermal processes (e.g., ball attach processes). For an embodiment, the TIM-1A layer in each cavity is cured and/or baked in accordance with at least one of the descriptions provided above in connection with FIGS. 2A-2B.

The method 300 of FIG. 3 is described above as being performed via several techniques known in the art. For one embodiment, the method 300 is performed using at least one of laser drilling, mechanically cutting, etching, forging, stamping, die casting, deposition techniques known in the art, or baking/curing techniques known in the art.

Figure 4:
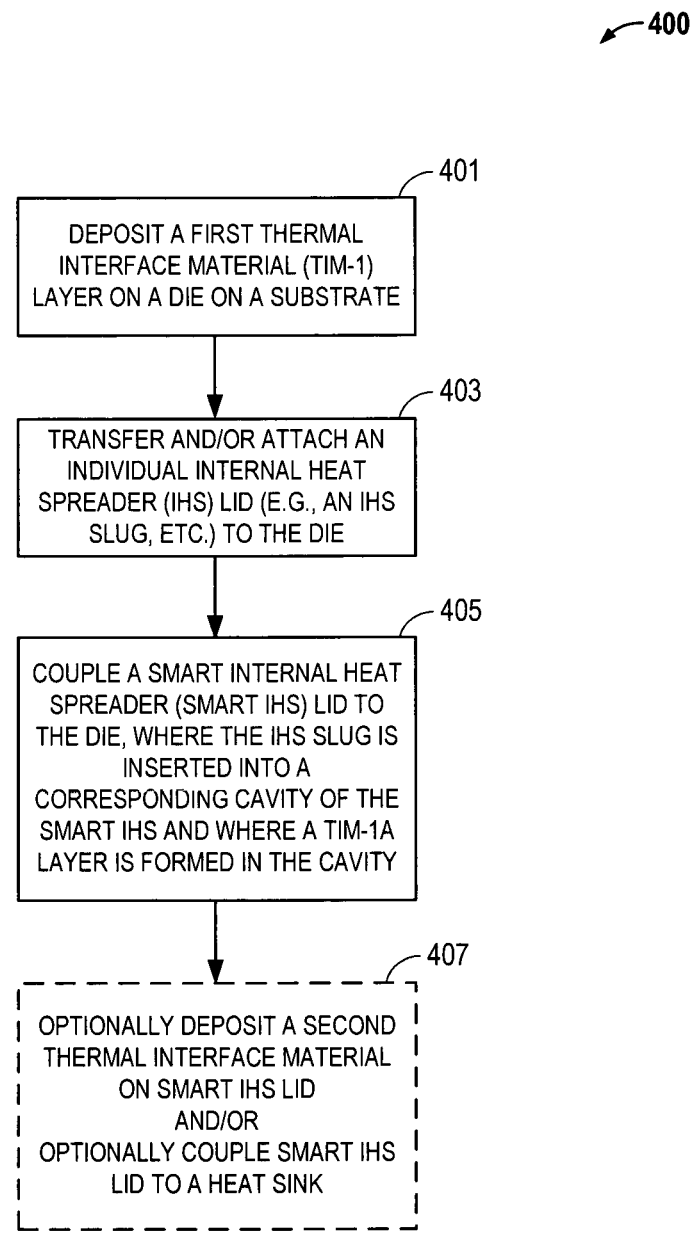
FIG. 4 is a process flow illustration of a method of forming a semiconductor package that includes a smart IHS solution, in accordance with one embodiment.

FIG. 4 is a process flow illustration of a method 400 of forming a semiconductor package (e.g., an MCP, etc.) that includes a smart IHS solution according to one embodiment. Process 400 begins at block 401, where a TIM-1 layer is deposited on a semiconductor die that is on a substrate. For one embodiment, the deposition of the TIM-1 layer is performed in accordance with the descriptions provided above in connection with at least one of FIG. 2C or 2D. Process 400 proceeds to block 403 where an IHS slug is transferred onto the die. For one embodiment, the IHS slug is attached to the die via the TIM-1 layer. For yet another embodiment, the IHS slug is transferred onto and/or attached to the die using at least one of the descriptions provided above in connection with at least one of FIGS. 2C-2D.

At block 405, a smart IHS lid is coupled to the IHS slug on the die. For one embodiment, the smart IHS lid is similar to or the same as at least one of the smart IHS lids described above in connection with at least one of FIGS. 2A-2D. Furthermore, and for one embodiment, the smart IHS lid is coupled to the IHS slug as described above in connection with at least one of FIG. 2C or 2D. For yet another embodiment, the smart IHS lid includes a cavity layered with a TIM-1A, as described above in connection with at least FIGS. 2B-2C. Moreover, the IHS slug is inserted into the corresponding cavity of the smart IHS solution, as described above in connection with at least FIGS. 2B-2C and 3. For this embodiment, there is some overlap between the smart IHS lid and the IHS slug because the cavity of the smart IHS lid surrounds some or all of the IHS slug. For a further embodiment, the smart IHS lid (at its sidewall regions) is also coupled to the substrate via a sealant. For this embodiment, the smart IHS lid is coupled to the substrate as described above in connection with at least FIG. 2C.

Process 400 also includes optional block 407, where a TIM-2 layer is deposited on the smart IHS lid. For one embodiment, the deposition of the TIM-2 layer on the smart IHS lid is performed as described above in connection with at least FIG. 2E. For one embodiment, a heat sink is coupled to the smart IHS lid following the deposition of the TIM-2 layer. For one embodiment, the heat sink is coupled to the smart IHS lid as described above in connection with at least FIG. 2E.

Figure 5A:
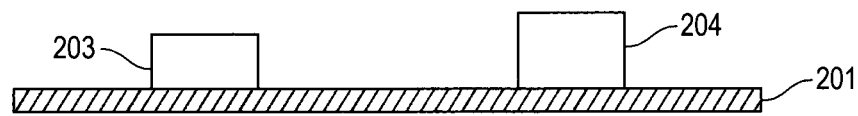
FIGS. 5A-5G are cross-sectional side view illustrations of a method of forming a semiconductor package that includes a smart IHS solution in accordance with an embodiment.

FIGS. 5A-5G are cross-sectional side view illustrations of a method of forming a semiconductor package 500 that includes a smart IHS solution in accordance with an embodiment. Referring now to FIG. 5A, the process of forming the package 500 can begin with a substrate 201. As shown in FIG. 5A, two components 203 and 204 are attached to the substrate 201 via techniques known in the art. For example, the two components 203 and 204 can be adhered to the substrate 201 using a sealant as is known in the art. The substrate 201 is similar to or the same as the substrate 201 described above in connection with FIGS. 2A-2D. For one embodiment, the component 203 is similar to or the same as the components 203 described above in connection with at least FIG. 2C. For one embodiment, the component 204 is similar to or the same as the component 204 described above in connection with at least FIG. 2C. As shown in FIG. 5A, there is a height variation affecting the components 203 and 204 on the substrate 201. The differing z-heights of the components 203 and 204 can have negative effects on dissipation of unwanted heat energy produced by at least one of the components 203 or 204. These negative effects can inhibit the performance of one or more of the components 203 and 204. Height variation is described above in connection with at least one of FIGS. 1A-1B.

Figure 5B:

Referring to FIG. 5B, TIM-1 layers 206 and 205 can be deposited onto surfaces of the components 203 and 204, respectively. For example, the TIM-1 layer 205 is deposited onto a surface of a semiconductor die or stack of dies on the component 204 and the TIM-1 layer 206 is deposited onto a surface of a semiconductor die or stack of dies on the component 203. For one embodiment, each of the TIM-1 layers 205 and 206 have the fixed predetermined z-height—for example, each of the TIM-1 layers 205 and 206 has a z-height of 50 µm. For one embodiment, the TIM-1 layer 205 shown in FIG. 5 is similar to or the same as the TIM-1 layer 205 described above in connection with at least one of FIGS. 2A-2E. For one embodiment, the TIM-1 layer 206 shown in FIG. 5 is similar to or the same as the TIM-1 layer 206 described above in connection with at least one of FIGS. 2A-2E. Details about TIM-1 layers are described above in connection with at least one of FIGS. 2A-2E.

Figure 5C:
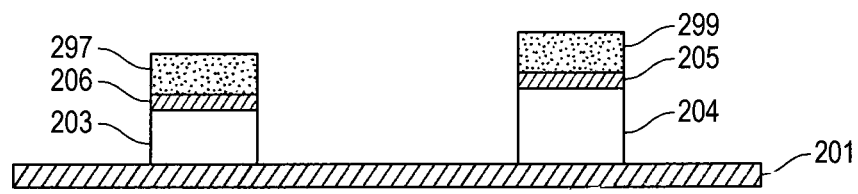

Referring to FIG. 5C, IHS slugs 297 and 299 can be transferred onto and/or attached to a surface of the components 203 and 204, respectively. For example, the IHS slug 297 is transferred onto and/or attached to a surface of a semiconductor die or a stack of dies on the component 203 and the IHS slug 299 is transferred onto and/or attached to a surface of a semiconductor die or a stack of dies on the component 204. For one embodiment, the TIM-1 layer 206 is used to couple the IHS slug 297 to the component 203, while the TIM-1 layer 205 is used to couple the IHS slug 299 to the component 204. For example, the IHS slug 297 is at least one of thermally coupled or mechanically coupled to the component 203, and the IHS slug 299 is at least one of thermally coupled or mechanically coupled to the component 204. For one embodiment, the IHS slug 297 shown in FIG. 5 is similar to or the same as the IHS slug 297 described above in connection with at least one of FIGS. 2A-2E. For one embodiment, the IHS slug 299 shown in FIG. 5 is similar to or the same as the IHS slug 299 described above in connection with at least one of FIGS. 2A-2E. For one embodiment, and with regard to FIG. 5C, when the IHS slugs 297 and 299 are transferred onto the TIM-1 layers 206 and 205, respectively, a force is applied to ensure that the BLT of each of the TIM-1 layers 206 and 205 is minimized. This application of a force can assist with ensuring a minimum BLT of each of the TIM-1 layers 206 and 205 (which assist with making the thickness of the lower thermal conductivity TIM as low as possible and with lowering overall thermal resistance).

For one embodiment, each of the IHS slugs 297 and 299 has a z-height that is selected from a predetermined range of z-heights—for example, 500 µm-2000 µm. For one embodiment, the IHS slugs 297 and 299 are thicker for those components with shorter z-heights than other components. For an alternate embodiment, the IHS slugs 297 and 299 are not thicker for those components with shorter z-heights than other components. For one embodiment, the IHS slugs 297 and 299 have the same length and width (i.e., x-y dimensions) as the respective component on which that IHS slugs sits. Thus, the IHS slug 297 has the same x-y dimensions as the component 203 and the IHS slug 299 has the same x-y dimensions as the component 204. For one embodiment, each of the IHS slugs 297 and 299 dissipates heat from its respective one of components 203 and 204 to a smart IHS lid 202. Additional details about IHS slugs are described above in connection with at least FIG. 2C.

Figure 5D:
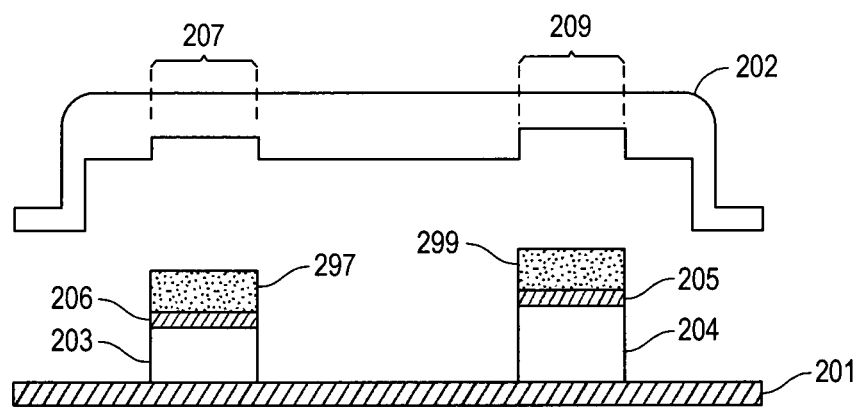

Referring to FIG. 5D, a smart IHS lid 202 is introduced to be added to the package 500 being formed. The smart IHS lid 202 will function to dissipate heat from the IHS slugs 297 and 299 to a secondary heat exchanger (e.g., a heat sink, an ambient environment, etc. This smart IHS lid 202 can assist with minimizing on-die temperature gradient caused by asymmetric power distribution associated with the components 203 and 204. As explained above in connection with at least FIG. 2C, each of the components 203 and 204 may be affected by a height variation. For example, components 203 and 204 may be the result of different fabrication processes, and in some instances, may be fabricated by different suppliers. This may lead to differences in height between the components 203 and 204 that are ultimately to be assembled into the semiconductor package 500 being formed. For one embodiment, the smart IHS lid 202 shown in FIG. 5 is similar to or the same as the smart IHS lid 202 described above in connection with at least one of FIGS. 2A-2E.

For one embodiment, and as shown in FIG. 5D, the smart IHS lid 202 includes cavities 207 and 209 that correspond to the IHS slugs 297 and 299, respectively. For one embodiment, the cavity 207 shown in FIG. 5 is similar to or the same as the cavity 207 described above in connection with at least one of FIGS. 2A-2E. For one embodiment, the cavity 209 shown in FIG. 5 is similar to or the same as the cavity 209 described above in connection with at least one of FIGS. 2A-2E. The smart IHS lid 202 may define a finite height relative to the component 203, the component 204, the IHS slug 297, the IHS slug 297, the TIM-1 layer 205, and the TIM-1 layer 206 that are on the substrate 201 into which each of these components will fit. Furthermore, and for one embodiment, each of the cavities 207 and 209 that are formed in the smart IHS lid 202 also defines a finite height relative to the component 203, the component 204, the IHS slug 297, the IHS slug 297, the TIM-1 layer 205, and the TIM-1 layer 206 that are on the substrate 201. The finite heights defined by the cavities 207 and 209 enable the IHS slugs 297 and 297 to be inserted into the cavities 207 and 209, respectively. Thus, design and fabrication of the smart IHS lid 202 may be performed to accommodate the thickest combination of a component, its respective TIM-1 layer, and its respective IHS slug that results due to the dimensional variability present in the fabrication process. As such, in some instances, where a component (e.g., components 203 and/or 204) is thinner due to the dimensional variability present in the fabrication process, the additional space between the thinner component and the smart IHS lid 202 may be filled with an IHS slug (e.g., IHS slugs 297 and/or 299) that is inserted into a cavity of the smart IHS lid 202 (e.g., cavities 207 and 209), where a TIM-1A layer (e.g., TIM-1A layers 211 and 213) is between the IHS slug and the cavity.

Figure 5E:
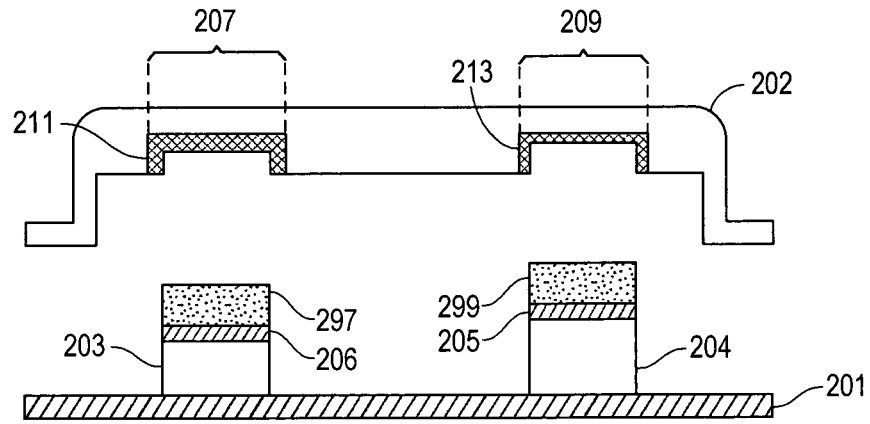

FIG. 5E includes intermediate level thermal interface (TIM-1A) layers 211 and 213 that are used, in addition to the cavities 207 and 209 and the IHS slugs 297 and 299, to reduce the variability in the component thickness and the variability in the thickness of the TIM-1 layers 205 and 206. For one embodiment, the TIM-1A layer 211 shown in FIG. 5 is similar to or the same as the TIM-1A layer 211 described above in connection with at least one of FIGS. 2A-2E. For one embodiment, the TIM-1A layer 213 shown in FIG. 5 is similar to or the same as the TIM-1A layer 213 described above in connection with at least one of FIGS. 2A-2E. For one embodiment, the cavities 207 and 209 are layered with TIM-1A layers 211 and 213, respectively. For one embodiment, each of the TIM-1A layers 211 and 213 are formed from materials that exhibit a high thermal conductivity. For one embodiment, each of TIM-1A layers 211 and 213 is formed from any of the materials described above in connection with at least one of FIGS. 2A-3. For one embodiment, the TIM-1A layers 211 and 213 are formed by curing the TIM-1A materials onto each of the walls of the cavities 207 and 209, respectively. For one embodiment, a thickness or BLT of the TIM-1A layer 211 is equal or substantially equal to a BLT of the TIM-1A layer 213. For another embodiment, a thickness or BLT of the TIM-1A layer 211 is different from a BLT of the TIM-1A layer 213. For this embodiment, each of the TIM-1A layers 211 and 213 have different z-heights relative to a top surface of the cavities 207 and 209 that is parallel to a top surface of the smart IHS lid 202. For this embodiment, the different z-heights of each of the TIM-1A layers 211 and 213 are selected from a predetermined range of z-heights—for example, 50 μm-450 μm. For one embodiment, the TIM-1A layers 211 and 213 are thicker for those components with shorter z-heights than other components. For one embodiment, the TIM-1A layers 211 and 213 are not thicker for those components with shorter z-heights than other components. Additional details about TIM-1A layers are described above in connection with at least FIGS. 2A-2E.

Figure 5F:
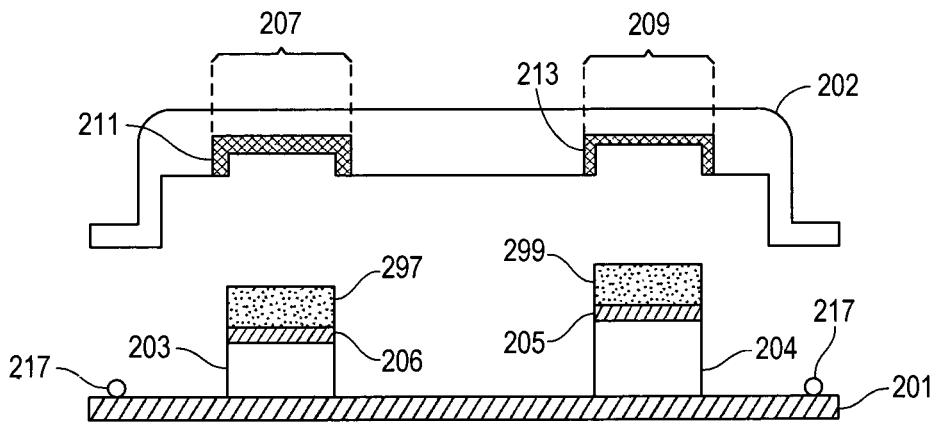

Referring to FIG. 5F, a sealant 217 is deposited onto the substrate 201 to be used for coupling sidewall regions of the smart IHS lid 202 to the substrate 201. For one embodiment, the sealant 217 is similar to or the same as the sealant 217 described above in connection with at least one of FIGS. 2A-2E. For one embodiment, the sealant 217 can be any one of the sealants described above in connection with at least FIGS. 2A-2D.

Figure 5G:
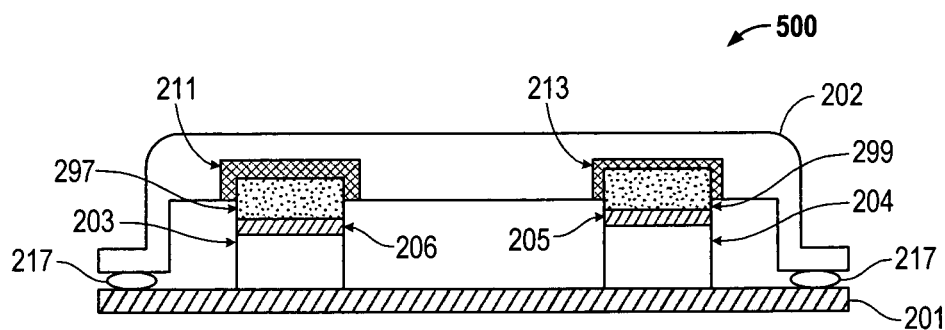

Referring now to FIG. 5G, which includes the formed package 500. For one embodiment, the package 500 is formed by attaching or thermally coupling the smart IHS lid 202 to the IHS slugs 297 and 299 using the TIM-1A layers 211 and 213. For one embodiment, the TIM-1A layers 211 and 213 couple the IHS slugs 297 and 299, respectively, to the smart IHS lid 202 thermally and/or mechanically. For one embodiment, and as shown in FIG. 5G, sidewall regions of the smart IHS lid 202 are thermally and/or mechanically coupled to the substrate 201 via the sealant 217. As shown in FIG. 5G, the IHS slugs 297 and 299 are inserted into the cavities 207 and 209, respectively. This creates some overlap between the smart IHS lid 202 and the IHS slugs 297 and 299, which can assist with improving dissipation of unwanted heat from components 203 and 204. For an embodiment, and with regard to FIGS. 5F-5G, when the smart IHS lid 202 is transferred onto the IHS slugs 297 and 299, a force is applied to the smart IHS lid 202 to ensure that the BLT of each of the TIM-1A layers 207 and 209 is minimized. This application of a force can assist with ensuring a minimum BLT of each of the TIM-1A layers 207 and 209 (which assist with making the thickness of the lower thermal conductivity TIM as low as possible and with lowering overall thermal resistance).

FIGS. 6A-6G are cross-sectional side view illustrations of a method of forming a semiconductor package 600 that includes a smart IHS solution in accordance with another embodiment.

The method shown in FIGS. 6A-6G is similar to or the same as the method shown in FIGS. 5A-5G. For the sake of brevity, only the differences between the method shown in FIGS. 6A-6G and the method shown in FIGS. 5A-5G are described below in connection with FIGS. 6A-6G.

Figure 6A:
FIGS. 6A-6G are cross-sectional side view illustrations of a method of forming a semiconductor package that includes a smart IHS solution in accordance with another embodiment.
Figure 6B:
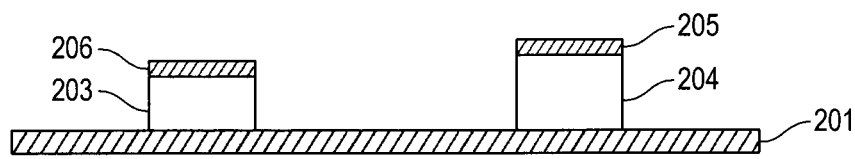
Figure 6C:
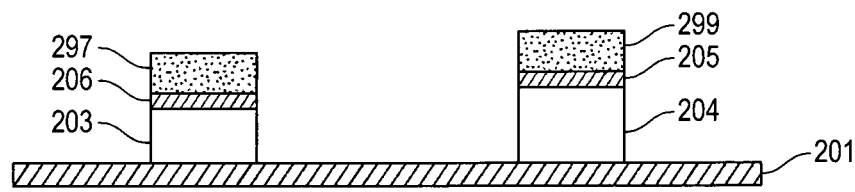
Figure 6D:
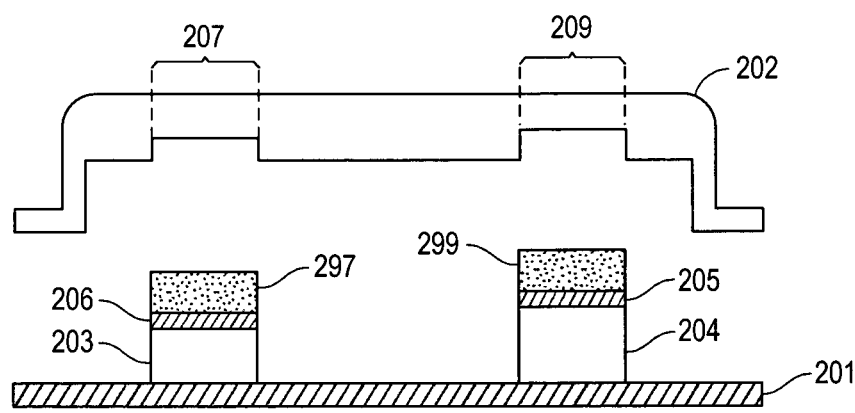
Figure 6E:
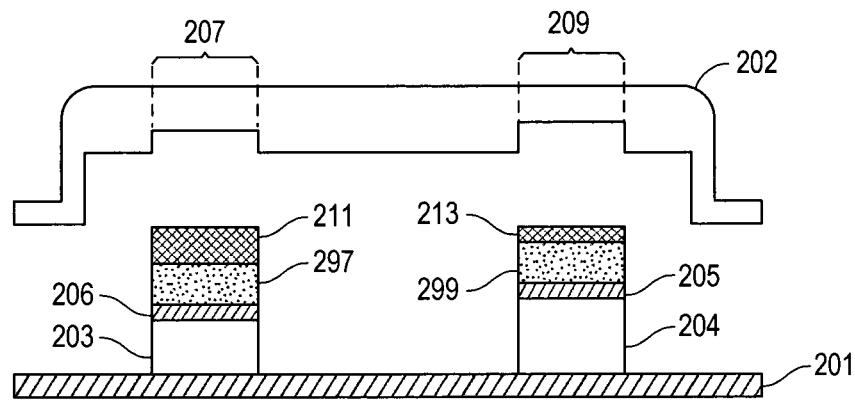
Figure 6F:
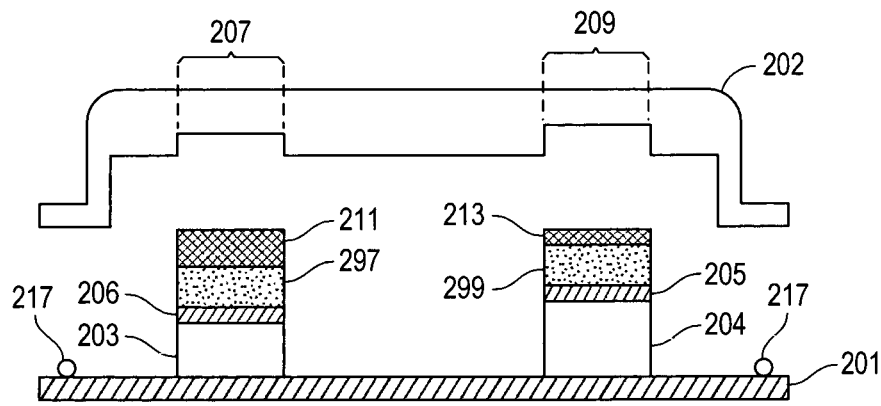
Figure 6G:
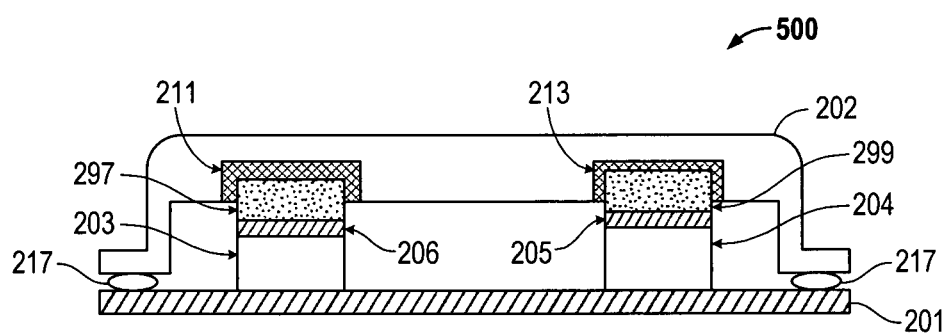

One difference between the method shown in FIGS. 6A-6G and the method shown in FIGS. 5A-5G can be found in FIGS. 6E, 6F, and 6G. As shown in FIGS. 6E-6F, walls of the cavities 207 and 209 are not layered with the TIM-1A layers 211 and 213, respectively. Instead, and for one embodiment, the TIM-1A layers 211 and 213 are deposited on the IHS slugs 297 and 299, respectively. For one embodiment, a thickness or bond line thickness (BLT) of the TIM-1A layer 211 shown in FIGS. 6E-6G can be different from a thickness or BLT of the TIM-1A layer 213 shown in FIGS. 6E-6G. For another embodiment, a thickness or BLT of the TIM-1A layer 211 shown in FIGS. 6E-6G can be equal or substantially equal to a thickness or BLT of the TIM-1A layer 213 shown in FIGS. 6E-6G. For one embodiment, the TIM-1A layers 211 and 213 shown in FIGS. 6E-6G are thicker for those components with shorter z-heights than other components. For one embodiment, the TIM-1A layers 211 and 213 shown in FIGS. 6E-6G are not thicker for those components with shorter z-heights than other components. For an embodiment, and as shown in FIGS. 6E-6G, the TIM-1A layer 211 has a higher BLT than the TIM-1A 213. For this embodiment, the differing BLT of the TIM-1A layers 211 and 213 can rectify the height variation that affects the components 203 and 204. For one embodiment, each BLT of the TIM-1A layers 211 and 213 shown in FIGS. 6E-6G is between 50 μm and 450 μm. In this way, the TIM-1A layers shown in FIGS. 6E-6G are restricted to a predetermined range, which can create some predictability in the ability of the TIM-1A layers 211 and 213 to dissipate heat from the IHS slugs 297 and 299, respectively.

With specific regard to FIG. 6G, the smart IHS lid 202 is over the component 203 and 204. Furthermore, the IHS slugs 297 and 299 are inserted into the cavities 207 and 209, respectively. For one embodiment, the package 500 may be cured and/or baked (after the IHS slugs 297 and 299 are inserted into the cavities 207 and 209) to enable the TIM-1A layers 211 and 213 to respectively couple the IHS slugs 297 and 299 to the smart IHS 202. For example, the IHS slug 297 is at least one of thermally coupled or mechanically coupled to the smart IHS 202 via the TIM-1A layer 211 during curing or baking, and the IHS slug 299 is at least one of thermally coupled or mechanically coupled to the smart IHS 202 via the TIM-1A layer during curing or baking. For an embodiment, and with regard to FIGS. 6E-6G, when the smart IHS lid 202 is transferred onto the TIM-1A layers 211 and 213, a force is applied to the smart IHS lid 202 to ensure that the BLT of each of the TIM-1A layers 211 and 213 shown in FIGS. 6E-6G is minimized. This application of a force can assist with ensuring a minimum BLT of each of the TIM-1A layers 211 and 213 shown in FIGS. 6E-6G (which assist with making the thickness of the lower thermal conductivity TIM as low as possible and with lowering overall thermal resistance).

For another embodiment, the TIM-1A layers 211 and 213 shown in FIGS. 6E-6G couple the IHS slugs 297 and 299 to the cavities 207 and 209 without any curing and/or baking. For this embodiment, the TIM-1A layers 211 and 213 adhere to the walls of the cavities 207 and 209 due to the properties (e.g., chemical properties, mechanical properties, magnetic properties, thermal properties, etc.) of the TIM(s) used for forming the TIM-1A layers 211 and 213.

Figure 7:
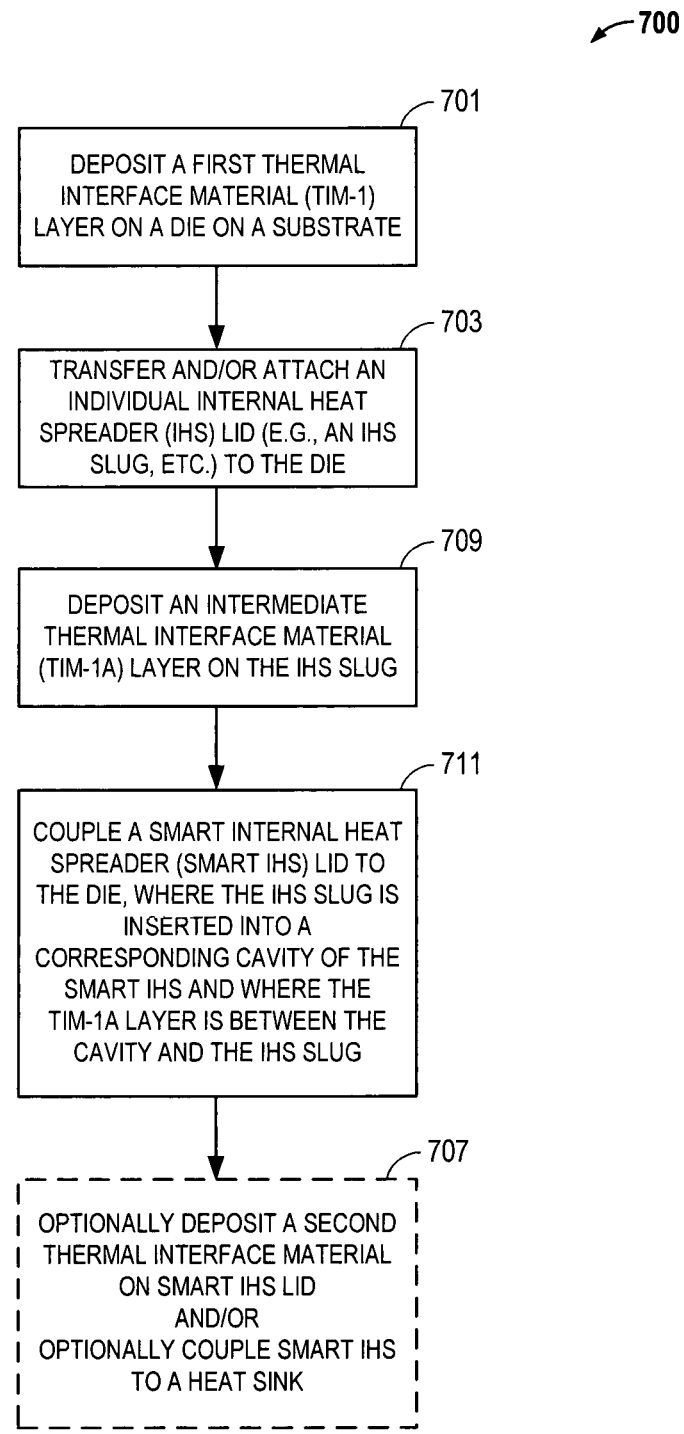
FIG. 7 is a process flow illustration of a method of forming a semiconductor package that includes a smart IHS solution, in accordance with another embodiment.

FIG. 7 is a process flow illustration of a method 700 of forming a semiconductor package (e.g., an MCP, etc.) that includes a smart IHS solution according to one embodiment. Process 700 can similar to, the same as, or different from the process 400 described above in connection with FIG. 4.

Process 700 begins at block 701, where a TIM-1 layer is deposited on a semiconductor die that is on a substrate. For one embodiment, the deposition of the TIM-1 layer is performed in accordance with at least one of the descriptions provided above in connection with at least one of FIG. 2C or 2D. Process 700 proceeds to block 703 where an IHS slug is transferred onto the die. For one embodiment, the IHS slug is attached to the die via the TIM-1 layer. For yet another embodiment, the IHS slug is transferred onto and/or attached to the die using at least one of the descriptions provided above in connection with at least one of FIGS. 2C-2D.

At block 709, process 700 includes deposition of a TIM-1A layer on the IHS slug. For one embodiment, the deposition of the TIM-1A layer is performed in accordance with the description provided above in connection with FIGS. 6E-6F. Process 701 proceeds to block 711, where a smart IHS lid is coupled to the IHS slug on the die. For one embodiment, the smart IHS lid is similar to or the same as at least one of the smart IHS lids described above in connection with at least one of FIGS. 2A-6G. Furthermore, and for one embodiment, the smart IHS lid is coupled to the IHS slug as described above in connection with at least one of FIGS. 6A-6G. For yet another embodiment, the smart IHS lid includes a cavity that has not been layered with a TIM-1A, as described above in connection with at least FIGS. 6E-6G. Moreover, the IHS slug, which has the TIM-1A layer deposited on it, is inserted into the corresponding cavity of the smart IHS lid, as described above in connection with at least FIGS. 6E-6G. For this embodiment, there is some overlap between the smart IHS lid and the IHS slug because the cavity of the smart IHS lid surrounds some or all of the IHS slug. For a further embodiment, the smart IHS lid (at its sidewall regions) is also coupled to the substrate via a sealant. For this embodiment, the smart IHS lid is coupled to the substrate as described above in connection with at least FIG. 2C.

Process 700 also includes optional block 707, where a TIM-2 layer is deposited on the smart IHS lid. For one embodiment, the deposition of the TIM-2 layer on the smart IHS lid is performed as described above in connection with at least FIG. 2E. For one embodiment, a heat sink is coupled to the smart IHS lid following the deposition of the TIM-2 layer. For one embodiment, the heat sink is coupled to the smart IHS lid as described above in connection with at least FIG. 2E.

Figure 8:
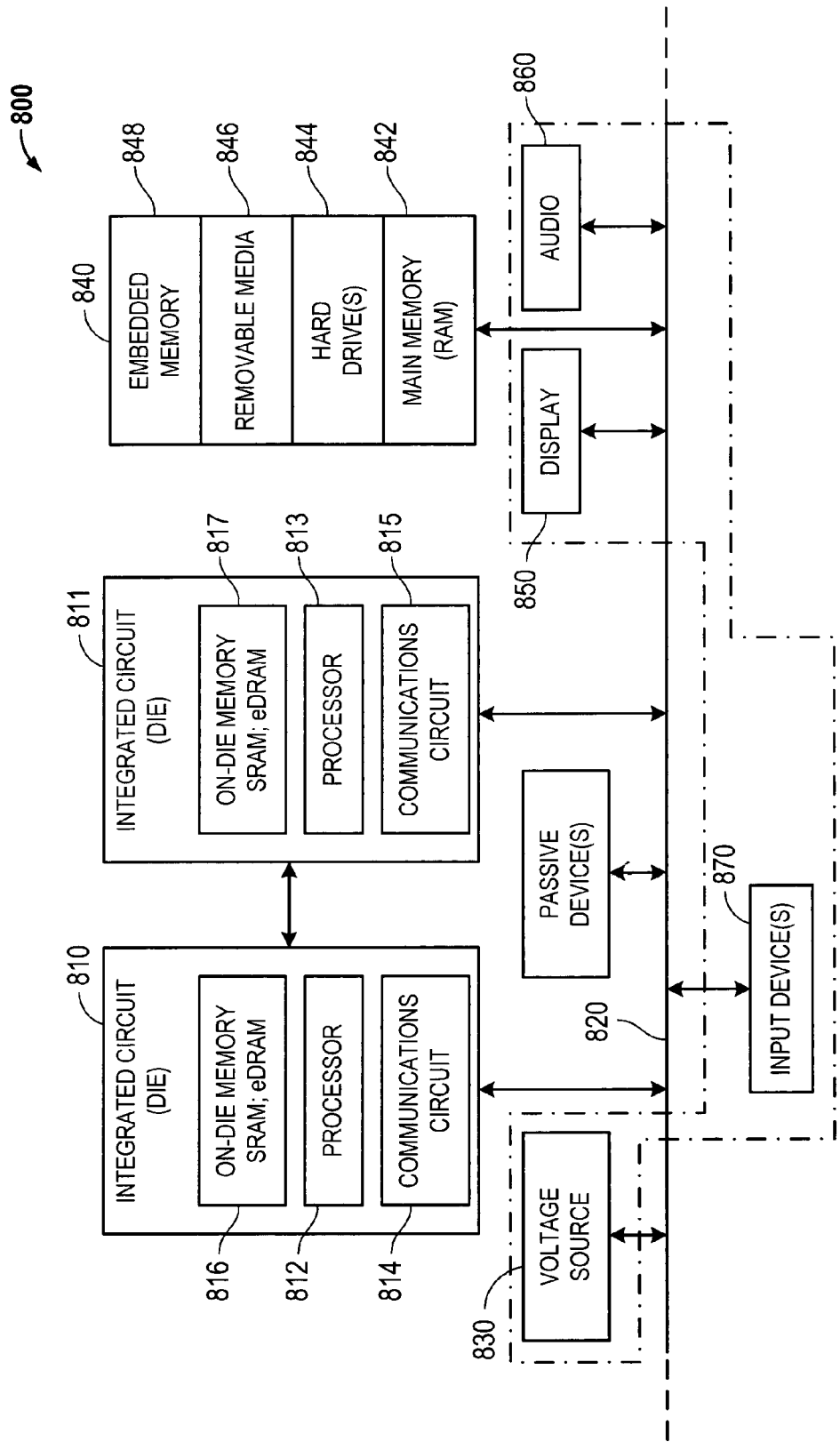
FIG. 8 is an illustration of a schematic block diagram of a computer system that utilizes a semiconductor package that includes a smart IHS solution, according to an embodiment.

FIG. 8 illustrates a schematic of computer system 800 according to an embodiment. The computer system 800 (also referred to as an electronic system 800) can include a semiconductor package (e.g., an MCP, etc.) that includes a smart IHS solution in accord with any of the embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

The electronic system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package (e.g., an MCP, etc.) that includes a smart IHS solution, as described in the foregoing specification. For an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. For an embodiment, the integrated circuit 810 includes on-die memory 816 such as static random-access memory (SRAM). For an embodiment, the integrated circuit 810 includes embedded on-die memory 816 such as embedded dynamic random-access memory (eDRAM). For one embodiment, the on-die memory 816 may be packaged as a semiconductor package (e.g., an MCP, etc.) that includes a smart IHS solution, as described in the foregoing specification.

For an embodiment, the integrated circuit 810 is complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package (e.g., an MCP, etc.) that includes a smart IHS solution, according to any of the several embodiments and their equivalents, an electronic system, a computer system, one or more methods of fabricating an integrated circuit, and one or more methods of fabricating an electronic assembly that includes a semiconductor package (e.g., an MCP, etc.) that includes a smart IHS solution, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed MCPs that include smart IHS solutions, according to any of the several disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," or their variations in various places throughout this specification are not necessarily referring to the same embodiment. Furthermore, the particular features, structures, configurations, or characteristics may be combined in any suitable manner in one or more embodiments. Furthermore, some operations in one or more embodiments of the process flows described herein (e.g., in at least one of FIG. 3, 4, 5A-5G, 6A-6G, or 7) may be omitted or performed in a sequence that is different from what is illustrated or described herein.

The terms "over," "to," "between," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments of a semiconductor package (e.g., an MCP, etc.) that includes a smart IHS solution may also be used for other types of IC packages and mixed logic-memory package stacks. In addition, the processing sequences used to form one or more embodiments of a semiconductor package (e.g., an MCP, etc.) that includes a smart IHS solution may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a semiconductor package comprising: a component on a substrate, the component including one or more semiconductor dies; and a smart integrated heat spreader (IHS) solution, the smart IHS solution including: a smart IHS lid, the smart IHS lid including a cavity formed in a central region of the smart lid, the smart IHS lid being on the component, and the cavity corresponding to the component.

Additional embodiments include a semiconductor package, wherein the smart integrated heat spreader (IHS) solution further comprises: an individual IHS lid (IHS slug) on a TIM-1 layer on the component, wherein the IHS slug is between the cavity and the component.

Additional embodiments include a semiconductor package, wherein sidewalls of the cavity surround sidewalls of the IHS slug such that at least one portion of the IHS slug is inserted in the cavity.

Additional embodiments include a semiconductor package, wherein the smart integrated heat spreader (IHS) solution further comprises: an intermediate level thermal interface material (TIM-1A) layer between the IHS slug and the cavity.

Additional embodiments include a semiconductor package, wherein the TIM-1A layer is formed in the cavity of the smart IHS lid before the IHS slug is inserted into the cavity.

Additional embodiments include a semiconductor package, wherein the TIM-1A layer is on the IHS slug before the before the IHS slug is inserted into the cavity.

Additional embodiments include a semiconductor package, wherein the TIM-1A layer includes at least one of a polymeric thermal interface material (PTIM), an epoxy, a liquid phase sintering (LPS) paste, or a solder paste.

Additional embodiments include a semiconductor package, wherein the smart IHS lid is thermally and mechanically coupled to the IHS slug.

Additional embodiments include a semiconductor package, wherein at least one sidewall region of the smart IHS lid is mechanically coupled to the substrate with a sealant.

Additional embodiments include a semiconductor package, further comprising: a heat sink on the smart IHS lid, the heat sink being coupled to the smart IHS lid; and a second thermal interface material (TIM-2) layer on the smart IHS lid, the TIM-2 layer being between the heat sink and the smart IHS lid.

Embodiments described herein include a method of forming a multi-chip package, comprising: depositing a first thermal interface material (TIM-1) layer on a semiconductor die on a substrate; transferring an individual integrated heat spreader lid (IHS slug) onto the die, wherein transferring the IHS slug onto the die includes applying, when the IHS slug is on the TIM-1 layer, a force to the IHS slug to cause the TIM-1 layer to have a predetermined bond line thickness (BLT); and thermally coupling a smart integrated heat spreader lid (smart IHS lid) to the IHS slug, wherein the smart IHS lid has a cavity, and wherein the cavity corresponds to the die.

Additional embodiments include a method of forming a multi-chip package, further comprising: inserting the IHS slug into the cavity of the smart IHS lid, wherein sidewalls of the cavity surround sidewalls of the IHS slug.

Additional embodiments include a method of forming a multi-chip package, further comprising: depositing an intermediate level thermal interface material (TIM-1A) layer in the cavity or on the IHS slug, wherein the TIM-1A layer is deposited before the IHS slug is inserted into the cavity.

Additional embodiments include a method of forming a multi-chip package, further comprising: when the TIM-1A layer is deposited in the cavity, curing or baking the TIM-1A to adhere the TIM-1A layer to walls of the cavity.

Additional embodiments include a method of forming a multi-chip package, wherein the TIM-1A layer is formed from at least one of a polymeric thermal interface material (PTIM), an epoxy, a liquid phase sintering (LPS) paste, or a solder paste.

Additional embodiments include a method of forming a multi-chip package, further comprising: depositing a second thermal interface material (TIM-2) layer on the smart IHS lid, and thermally coupling a heat sink to the smart IHS lid, the TIM-2 layer being between the heat sink and the smart IHS lid.

Additional embodiments include a method of forming a multi-chip package, further comprising mechanically coupling at least one sidewall region of the smart IHS lid to the substrate with a sealant.

Embodiments described herein include a computing device comprising: a circuit board; and a semiconductor package coupled to the circuit board, the package including: a component on a substrate, the component including one or more semiconductor dies; and a smart integrated heat spreader (IHS) solution, the smart IHS solution including: a smart IHS lid, the smart IHS lid including a cavity formed in a central region of the smart lid, the smart IHS lid being on the component, and the cavity corresponding to the component.

Additional embodiments include a computing device, wherein the smart integrated heat spreader (IHS) solution further comprises: an individual IHS lid (IHS slug) on a TIM-1 layer on the component, wherein the IHS slug is between the cavity and the component.

Additional embodiments include a computing device, wherein sidewalls of the cavity surround sidewalls of the IHS slug such that at least one portion of the IHS slug is inserted in the cavity.

Additional embodiments include a computing device, wherein the smart integrated heat spreader (IHS) solution further comprises: an intermediate level thermal interface material (TIM-1A) layer between the IHS slug and the cavity.

Additional embodiments include a computing device, wherein the TIM-1A layer is formed in the cavity of the smart IHS lid before the IHS slug is inserted into the cavity.

Additional embodiments include a computing device, wherein the TIM-1A layer is on the IHS slug before the before the IHS slug is inserted into the cavity.

Additional embodiments include a computing device, wherein the TIM-1A layer includes at least one of a polymeric thermal interface material (PTIM), an epoxy, a liquid phase sintering (LPS) paste, or a solder paste.

Additional embodiments include a computing device, wherein the smart IHS lid is coupled to the IHS slug.

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor package comprising:
   a component on a substrate, the component including two or more semiconductor dies having a different thickness;
   an integrated heat spreader (IHS) solution, the IHS solution including:
      an IHS lid, the IHS lid including a plurality of cavities formed in a central region of the IHS lid, the plurality of cavities including at least one or more sidewalls formed into the IHS lid, wherein the plurality of cavities includes an intermediate level thermal interface having different thicknesses material layer formed on each sidewall of the plurality of cavities; and
      an individual IHS slug on a first thermal interface material layer on the component, wherein the IHS slug is between the intermediate level thermal interface material layer and the first thermal interface material layer on the component, wherein the IHS lid being on the intermediate level thermal interface material layer, the IHS slug, and the first thermal interface material layer on the component, respectively, and wherein the intermediate level thermal interface material layer is embedded between each sidewall of the plurality of cavities and the IHS slug.

2. The package of claim 1, wherein the sidewalls of the plurality of cavities surround sidewalls of the IHS slug such that at least one portion of the IHS slug is inserted in the plurality of cavities.

3. The package of claim 1, wherein the IHS solution further comprises:
   the intermediate level thermal interface material layer between the IHS slug and the plurality of cavities.

4. The package of claim 3, wherein the intermediate level thermal interface material layer is formed in the plurality of cavities of the IHS lid before the IHS slug is inserted into the cavity.

5. The package of claim 3, wherein the intermediate level thermal interface material layer is on the IHS slug before the IHS slug is inserted into the plurality of cavities.

6. The package of claim 3, wherein the intermediate level thermal interface material layer includes at least one of a polymeric thermal interface material (PTIM), an epoxy, a liquid phase sintering (LPS) paste, or a solder paste.

7. The package of claim 1, wherein the IHS lid is thermally and mechanically coupled to the IHS slug.

8. The package of claim 1, wherein at least one sidewall region of the IHS lid is mechanically coupled to the substrate with a sealant.

9. The package of claim 1, further comprising:
   a heat sink on the IHS lid, the heat sink being coupled to the IHS lid; and
   a second thermal interface material layer on the IHS lid, the second thermal interface material layer being between the heat sink and the IHS lid.

10. A method of forming a multi-chip package, comprising:
    depositing a first thermal interface material layer on a plurality of semiconductor dies on a substrate;

transferring an individual integrated heat spreader slug onto the die, wherein transferring the IHS slug onto the plurality of semiconductor dies includes applying, when the IHS slug is on the first thermal interface material layer, a force to the IHS slug to assist with causing the first thermal interface material layer to have a predetermined bond line thickness (BLT); and thermally coupling an integrated heat spreader lid (IHS lid) to the IHS slug, wherein the IHS lid has a plurality of cavities formed in a central region of the IHS lid, the plurality of cavities including at least one or more sidewalls formed into the IHS lid, wherein the plurality of cavities includes an intermediate level thermal interface material layer having different thicknesses formed on each sidewall of the plurality of cavities, wherein the IHS slug is between the intermediate level thermal interface material layer and the first thermal interface material layer on the die, wherein the IHS lid being on the intermediate level thermal interface material layer, the IHS slug, and the first thermal interface material layer on the component, respectively, and wherein the intermediate level thermal interface material layer is embedded between each sidewall of the plurality of cavities and the IHS slug.

11. The method of claim 10, further comprising:
inserting the IHS slug into the plurality of cavities of the IHS lid, wherein the sidewalls of the cavity surround sidewalls of the IHS slug.

12. The method of claim 11, further comprising:
depositing the intermediate level thermal interface material layer in the plurality of cavities or on the IHS slug, wherein the intermediate level thermal interface material layer is deposited before the IHS slug is inserted into the plurality of cavities.

13. The method of claim 12, further comprising:
when the intermediate level thermal interface material layer is deposited in the plurality of cavities, curing or baking the intermediate level thermal interface material layer to adhere the intermediate level thermal interface material layer to the sidewalls of the plurality of cavities.

14. The method of claim 12, wherein the intermediate level thermal interface material layer is formed from at least one of a polymeric thermal interface material (PTIM), an epoxy, a liquid phase sintering (LPS) paste, or a solder paste.

15. The method of claim 10, further comprising:
depositing a second thermal interface material layer on the IHS lid, and
thermally coupling a heat sink to the IHS lid, the second thermal interface material layer being between the heat sink and the IHS lid.

16. The method of claim 10, comprising
mechanically coupling at least one sidewall region of the IHS lid to the substrate with a sealant.

17. A computing device comprising:
a circuit board; and
a semiconductor package coupled to the circuit board, the package including:
 a component on a substrate, the component including two or more semiconductor dies; and
 an integrated heat spreader (IHS) solution, the IHS solution including:
an IHS lid, the IHS lid including a plurality of cavities formed in a central region of the IHS lid, the plurality of cavities including at least one or more sidewalls formed into the IHS lid, wherein the plurality of cavities includes an intermediate level thermal interface material layer having different thicknesses formed on each sidewall of the plurality of cavities; and
an individual IHS slug on a first thermal interface material layer on the component, wherein the IHS slug is between the intermediate level thermal interface material layer and the first thermal interface material layer on the component, wherein the IHS lid being on the intermediate level thermal interface material layer, the IHS slug, and the first thermal interface material layer on the component respectively, and wherein the intermediate level thermal interface material layer is embedded between each sidewall of the plurality of cavities and the IHS slug.

18. The computing device of claim 17, wherein the sidewalls of the plurality of cavities surround sidewalls of the IHS slug such that at least one portion of the IHS slug is inserted in the plurality of cavities.

19. The computing device of claim 17, wherein the IHS solution further comprises:
the intermediate level thermal interface material layer between the IHS slug and the plurality of cavities.

20. The computing device of claim 19, wherein the intermediate level thermal interface material layer is formed in the plurality of cavities of the IHS lid before the IHS slug is inserted into the plurality of cavities.

21. The computing device of claim 19, wherein the intermediate level thermal interface material layer is on the IHS slug before the IHS slug is inserted into the plurality of cavities.

22. The computing device of claim 19, wherein the intermediate level thermal interface material layer includes at least one of a polymeric thermal interface material (PTIM), an epoxy, a liquid phase sintering (LPS) paste, or a solder paste.

23. The computing device of claim 17, wherein the IHS lid is coupled to the IHS slug.

* * * * *